US012586004B2

(12) United States Patent
Kim et al.

(10) Patent No.: US 12,586,004 B2
(45) Date of Patent: Mar. 24, 2026

(54) METHODS OF PREDICTING RELIABILITY INFORMATION OF STORAGE DEVICES AND METHODS OF OPERATING STORAGE DEVICES

(71) Applicant: Samsung Electronics Co., Ltd., Suwon-si (KR)

(72) Inventors: Chanha Kim, Hwaseong-si (KR); Youngeun Kim, Yongin-si (KR); Kangho Roh, Seoul (KR); Younghoon Jung, Seoul (KR); Mijung Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1113 days.

(21) Appl. No.: 17/497,076

(22) Filed: Oct. 8, 2021

(65) Prior Publication Data

US 2022/0253749 A1 Aug. 11, 2022

(30) Foreign Application Priority Data

Feb. 5, 2021 (KR) ......................... 10-2021-0016498

(51) Int. Cl.
*G06N 20/20* (2019.01)
*G11C 16/26* (2006.01)

(52) U.S. Cl.
CPC ............. *G06N 20/20* (2019.01); *G11C 16/26* (2013.01)

(58) Field of Classification Search
CPC ................................ G06N 20/20; G11C 16/26
See application file for complete search history.

(56) References Cited

U.S. PATENT DOCUMENTS

| | | | |
|---|---|---|---|
| 9,141,457 B1 * | 9/2015 | Ma | G06F 11/008 |
| 10,216,422 B2 | 2/2019 | Kim et al. | |
| 10,417,733 B2 | 9/2019 | Kachare et al. | |
| 10,424,388 B2 | 9/2019 | Oh et al. | |
| 10,540,683 B2 * | 1/2020 | Gao | G06Q 30/0251 |

(Continued)

FOREIGN PATENT DOCUMENTS

| | | |
|---|---|---|
| JP | 2016143220 A | 8/2016 |
| KR | 102121562 B1 | 6/2020 |

*Primary Examiner* — Phenuel S Salomon
(74) *Attorney, Agent, or Firm* — Wolf, Greenfield & Sacks, P.C.

(57) ABSTRACT

In a method of operating a storage device including a plurality of nonvolatile memories, reliability information of the storage device is predicted. A read operation on the storage device is performed based on a result of predicting the reliability information. In the predicting the reliability information of the storage device, a model request signal is outputted by selecting one of a plurality of machine learning models as an optimal machine learning model based on deterioration characteristic information and deterioration phase information. The model request signal corresponds to the optimal machine learning model. The plurality of machine learning models are used to generate first reliability information related to the plurality of nonvolatile memories. First parameters of the optimal machine learning model may be received based on the model request signal. The first reliability information is generated based on the deterioration characteristic information and the first parameters.

20 Claims, 19 Drawing Sheets

(56)                    References Cited

U.S. PATENT DOCUMENTS

| | | | | |
|---|---|---|---|---|
| 10,878,144 | B2 | 12/2020 | Nendorf et al. | |
| 2007/0079170 | A1* | 4/2007 | Zimmer | G06F 11/008 |
| | | | | 714/6.23 |
| 2016/0224447 | A1 | 8/2016 | Nakao | |
| 2018/0108422 | A1* | 4/2018 | Oh | G11C 7/14 |
| 2019/0114078 | A1* | 4/2019 | Oh | G06F 3/0632 |
| 2019/0354488 | A1 | 11/2019 | Gupta et al. | |
| 2019/0354496 | A1 | 11/2019 | Nielsen et al. | |
| 2020/0076223 | A1* | 3/2020 | Kuriki | H01M 10/44 |
| 2020/0110547 | A1 | 4/2020 | Lee et al. | |
| 2020/0117652 | A1 | 4/2020 | Nakatani | |
| 2020/0133758 | A1* | 4/2020 | Liu | G06F 3/0689 |
| 2020/0151294 | A1 | 5/2020 | Kim | |
| 2020/0159445 | A1 | 5/2020 | Kachare et al. | |
| 2020/0210831 | A1* | 7/2020 | Zhang | G06N 3/08 |
| 2021/0012047 | A1 | 1/2021 | Nendorf et al. | |
| 2021/0072920 | A1* | 3/2021 | Lee | G06F 11/3037 |
| 2021/0109660 | A1* | 4/2021 | Kim | G06F 11/1068 |
| 2021/0200448 | A1* | 7/2021 | Chen | G06F 3/0634 |
| 2021/0202028 | A1* | 7/2021 | Choi | G11C 29/4401 |

* cited by examiner

START

OUTPUT MODEL REQUEST SIGNAL BY SELECTING ONE OF A
PLURALITY OF MACHINE LEARNING MODELS AS OPTIMAL
MACHINE LEARNING MODEL ~S100

RECEIVE FIRST PARAMETERS OF OPTIMAL MACHINE LEARNING
MODEL BASED ON MODEL REQUEST SIGNAL ~S200

GENERATE FIRST RELIABILITY INFORMATION BASED ON THE
DETERIORAION CHARACTERISTIC INFORMATION AND THE FIRST
PARAMETERS ~S300

END

Figure 8:
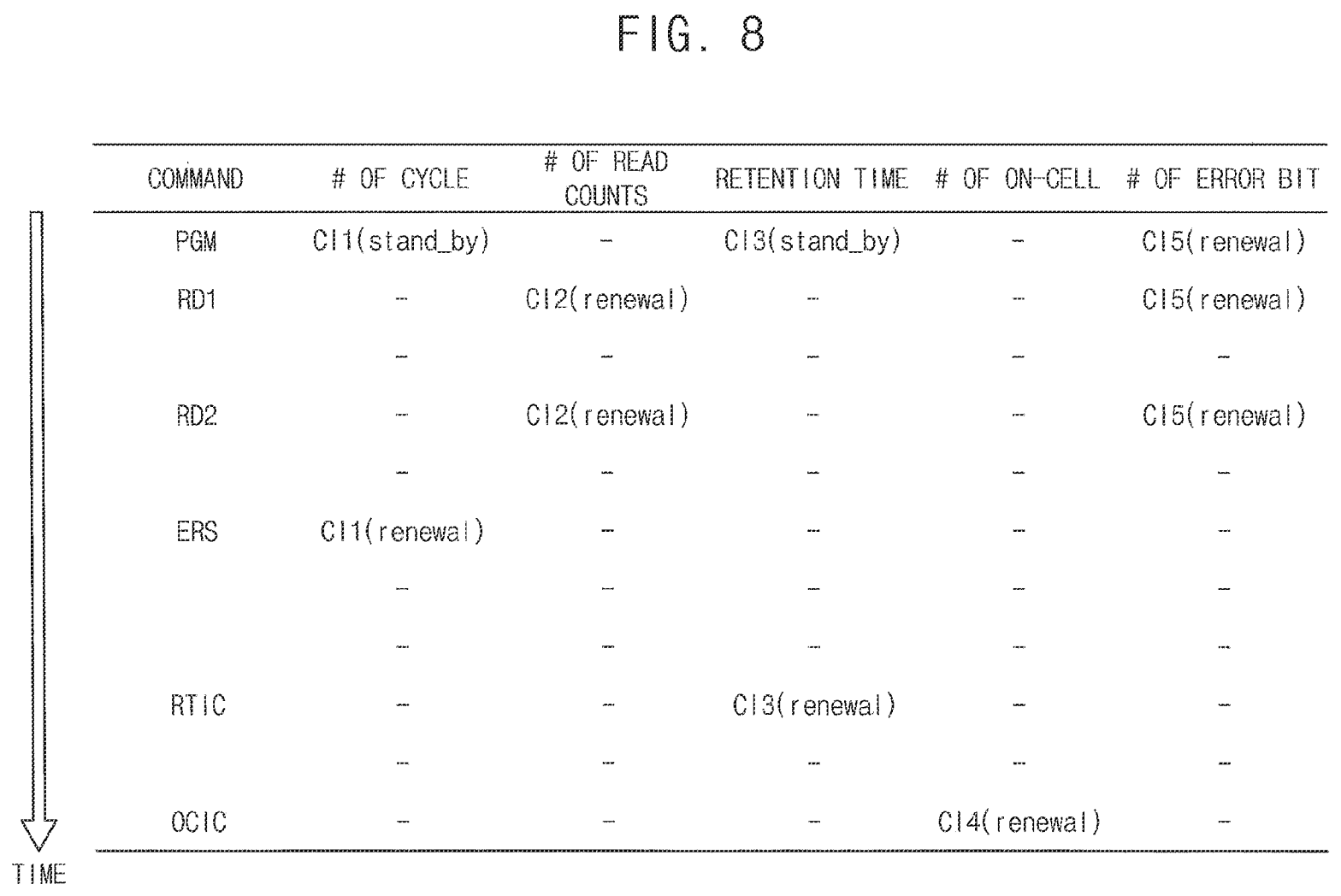

| COMMAND | # OF CYCLE | # OF READ COUNTS | RETENTION TIME | # OF ON-CELL | # OF ERROR BIT |
|---|---|---|---|---|---|
| PGM | CI1(stand_by) | - | CI3(stand_by) | - | CI5(renewal) |
| RD1 | - | CI2(renewal) | - | - | CI5(renewal) |
| | - | - | - | - | - |
| RD2 | - | CI2(renewal) | - | - | CI5(renewal) |
| | - | - | - | - | - |
| ERS | CI1(renewal) | - | - | - | - |
| | - | - | - | - | - |
| | - | - | - | - | - |
| RTIC | - | - | CI3(renewal) | - | - |
| | - | - | - | - | - |
| OCIC | - | - | - | CI4(renewal) | - |

TIME

FIG. 11

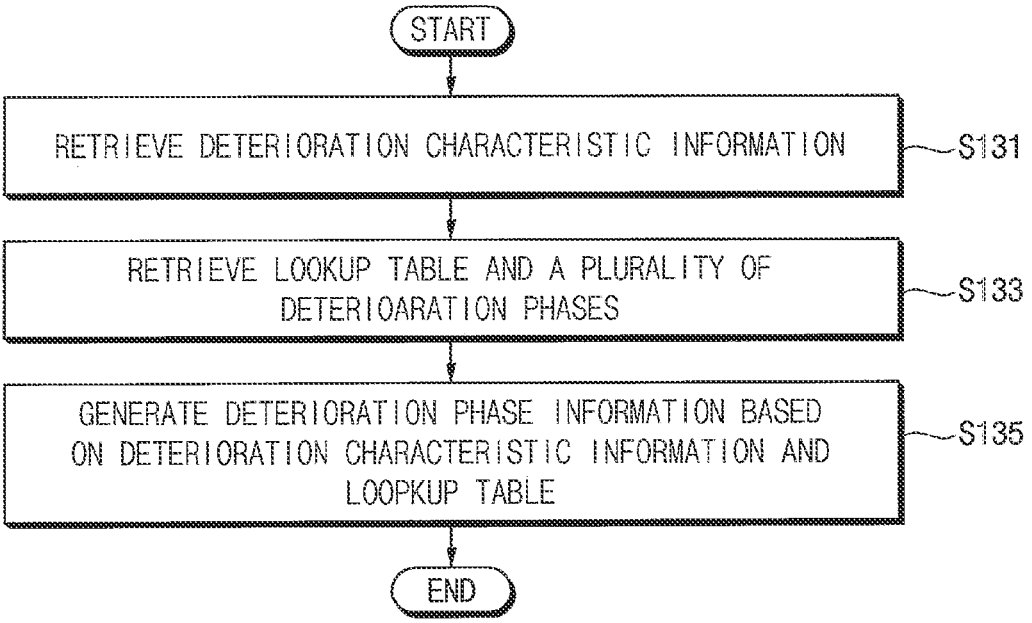

START

RETRIEVE DETERIORATION CHARACTERISTIC INFORMATION ～S131

RETRIEVE LOOKUP TABLE AND A PLURALITY OF DETERIOARATION PHASES ～S133

GENERATE DETERIORATION PHASE INFORMATION BASED ON DETERIORATION CHARACTERISTIC INFORMATION AND LOOPKUP TABLE ～S135

END

FIG. 12

| DCI_INFO | DSI_INFO |
|---|---|
| DCI_INFO_1 | DSI_INFO_1 |
| DCI_INFO_2 | DSI_INFO_2 |
| DCI_INFO_3 | DSI_INFO_3 |
| DCI_INFO_4 | DSI_INFO_4 |
| DCI_INFO_5 | DSI_INFO_5 |
| DCI_INFO_6 | DSI_INFO_6 |
| DCI_INFO_7 | DSI_INFO_7 |
| DCI_INFO_8 | DSI_INFO_8 |
| DCI_INFO_9 | DSI_INFO_9 |
| DCI_INFO_10 | DSI_INFO_10 |

FIG. 14

| DCI_INFO | ML MODEL | | | | | |
|---|---|---|---|---|---|---|
| | PROCESSING SPEED | ACCURACY | CONFUSION MATRIX | PRECISION | RECALL | F1 SCORE |
| DCI_INFO_1 | MM1 | MM10 | MM1 | MM8 | MM1 | MM1 |
| DCI_INFO_2 | MM2 | MM9 | MM2 | MM9 | MM6 | MM2 |
| DCI_INFO_3 | MM3 | MM8 | MM3 | MM10 | MM2 | MM3 |
| DCI_INFO_4 | MM4 | MM7 | MM7 | MM1 | MM7 | MM4 |
| DCI_INFO_5 | MM5 | MM6 | MM8 | MM2 | MM3 | MM5 |
| DCI_INFO_6 | MM6 | MM5 | MM9 | MM3 | MM8 | MM10 |
| DCI_INFO_7 | MM7 | MM4 | MM4 | MM4 | MM4 | MM9 |
| DCI_INFO_8 | MM8 | MM3 | MM5 | MM5 | MM9 | MM8 |
| DCI_INFO_9 | MM9 | MM2 | MM6 | MM6 | MM5 | MM7 |
| DCI_INFO_10 | MM10 | MM1 | MM10 | MM7 | MM10 | MM6 |

F I G. 20
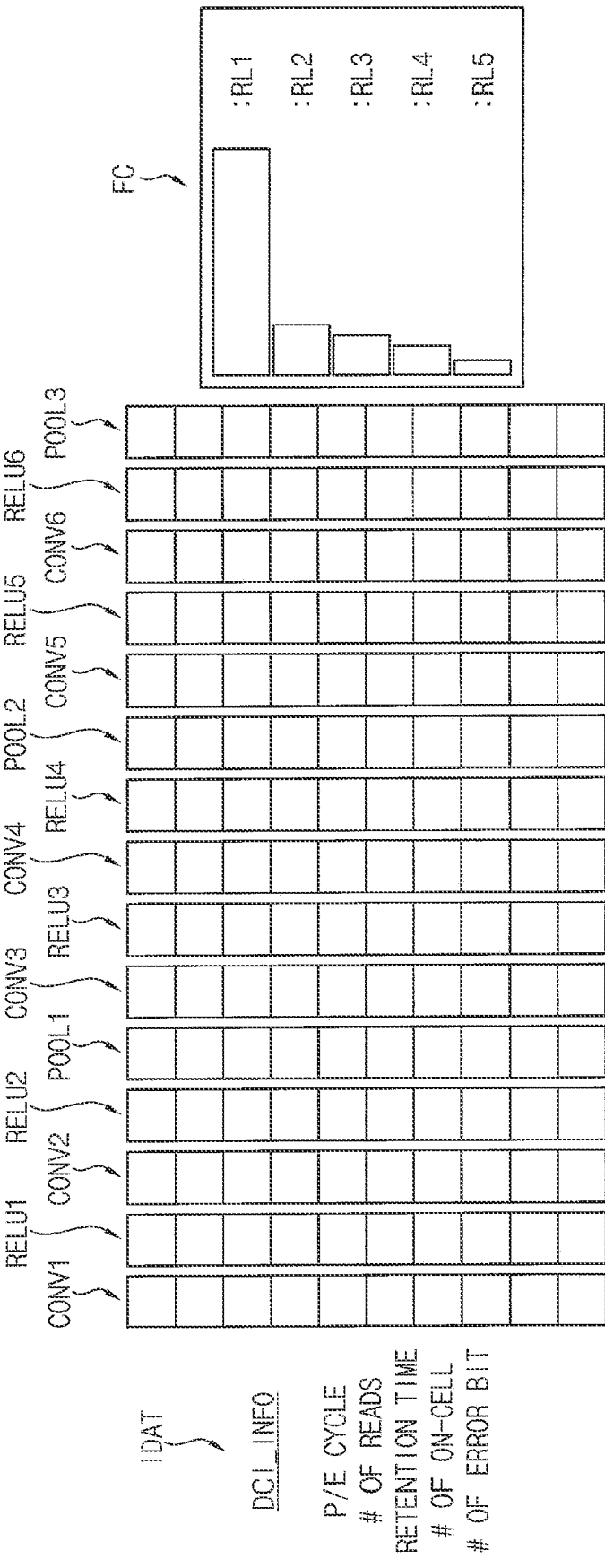

METHODS OF PREDICTING RELIABILITY INFORMATION OF STORAGE DEVICES AND METHODS OF OPERATING STORAGE DEVICES

CROSS-REFERENCE TO RELATED APPLICATION

This U.S. non-provisional application claims priority under 35 USC § 119 to Korean Patent Application No. 10-2021-0016498, filed on Feb. 5, 2021, in the Korean Intellectual Property Office (KIPO), the disclosure of which is incorporated by reference herein in its entirety.

BACKGROUND

1. Technical Field

The present disclosure relates generally to semiconductor integrated circuits, and more particularly to methods of predicting reliability information of storage devices and to methods of operating the storage devices.

2. Discussion of the Related Art

A storage device may be classified as either a volatile storage device that includes volatile memories, or as a nonvolatile storage device that includes nonvolatile memories. The classification may be based on whether data stored in the storage device is lost when a power is cut off or removed. A volatile memory may read and write faster, however, data stored in the volatile memory is lost when the power is cut off or removed. In contrast, data stored in the nonvolatile memory is retained when the power is cut off or removed. Therefore, the nonvolatile memory may be used to store persistent data that can be retrieved later if the supplied power is cut off or removed. As the nonvolatile memory is widely used, various methods for predicting reliability information of the storage device using machine learning models have been studied and are under study. However, in predicting the reliability information of the storage device, if a degree of deterioration of the nonvolatile memory included in the storage device is not considered, a reliability of result data according to the prediction may be lowered.

SUMMARY

Some example embodiments may provide methods for storage devices that are capable of predicting reliability information of a nonvolatile memory included in the storage device.

According to some example embodiments, in a method of predicting reliability of a storage device including a plurality of nonvolatile memories, a model request signal may be outputted by selecting one of a plurality of machine learning models as an optimal machine learning model with each of the plurality of machine learning models configured to generate first reliability information related to the plurality of nonvolatile memories and the selecting of the one of the plurality of machine learning models based on deterioration characteristic information obtained by accumulating deterioration information related to the plurality of nonvolatile memories and deterioration phase information representing a degree of deterioration of the plurality of nonvolatile memories. First parameters of the optimal machine learning model are received based on the model request signal. The first reliability information is generated based on the deterioration characteristic information and the first parameters.

According to example embodiments, in a method of operating a storage device including a plurality of nonvolatile memories, reliability information of the storage device is predicted. A read operation on the storage device is performed based on a result of predicting the reliability information. In the predicting the reliability information of the storage device, a model request signal is outputted by selecting one of a plurality of machine learning models as an optimal machine learning model with each of the plurality of machine learning models configured to generate first reliability information related to the plurality of nonvolatile memories and the selecting of the one of the plurality of machine learning models based on deterioration characteristic information obtained by accumulating deterioration information related to the plurality of nonvolatile memories and deterioration phase information representing a degree of deterioration of the plurality of nonvolatile memories. First parameters of the optimal machine learning model may be received based on the model request signal. The first reliability information is generated based on the deterioration characteristic information and the first parameters.

According to example embodiments, in a method of predicting reliability of a storage device including a plurality of nonvolatile memories, deterioration characteristic information is collected. The deterioration characteristic information is obtained by accumulating deterioration of the plurality of nonvolatile memories. Deterioration phase information is generated based on the deterioration characteristic information. The deterioration phase information represents a degree of the deterioration of the plurality of nonvolatile memories as a plurality of deterioration phases. One of a plurality of machine learning models is selected as an optimal machine learning model based on the deterioration phase information and the deterioration phase information. A model request signal is outputted by selecting one of a plurality of machine learning models as an optimal machine learning model based on deterioration characteristic information and deterioration phase information. The model request signal corresponds to the optimal machine learning model. The plurality of machine learning models are used to generate first reliability information related to the plurality of nonvolatile memories. The deterioration characteristic information is obtained by accumulating deterioration of the plurality of nonvolatile memories. The deterioration phase information represents a degree of the deterioration of the plurality of nonvolatile memories. First parameters of the optimal machine learning model are received based on the model request signal. The first reliability information is generated based on the deterioration characteristic information and the first parameters. A first machine learning model is selected from among the plurality of machine learning models as the optimal machine learning model when the deterioration phase information corresponds to an early deterioration phase, and a second machine learning model different from the first machine learning model is selected from among the plurality of machine learning models as the optimal machine learning model when the deterioration phase information corresponds to a middle deterioration phase that is subsequent to the early deterioration phase.

As described above, in methods of predicting reliability information of a storage device, a model request signal may be outputted based on deterioration characteristic information and deterioration phase information. The reliability information of the nonvolatile memory may be predicted by adaptively selecting an optimal machine learning model based on the model request signal, where the optimal machine learning model is selected from a plurality of machine learning models. The methods of predicting the reliability information of the storage device and other example embodiments described herein may more efficiently predict the reliability information of the nonvolatile memory by adaptively reading parameters of the optimal machine learning model in consideration of the degree of deterioration of the nonvolatile memory.

BRIEF DESCRIPTION OF THE DRAWINGS

Example embodiments of the present disclosure will be more clearly understood from the following detailed description taken in conjunction with the accompanying drawings.

FIG. 5 is a block diagram illustrating a nonvolatile memory and a memory system including the nonvolatile memory according to some example embodiments.

FIGS. 8, 9 and 10 are diagrams for describing a process of generating the deterioration characteristic information in FIG. 6.

FIG. 11 is a flowchart illustrating an example of generating deterioration phase information in FIG. 6.

FIG. 12 is a diagram illustrating an example of a lookup table representing a relationship between the deterioration characteristic information and a plurality of deterioration phases.

FIG. 14 is a diagram illustrating an example of an evaluation result obtained by evaluating a plurality of machine learning models according to a plurality of model evaluation criteria.

FIGS. 19, 20 and 21 are diagrams for describing an artificial neural network as an example of the plurality of machine learning models according to some example embodiments.

DETAILED DESCRIPTION

Figure 1:
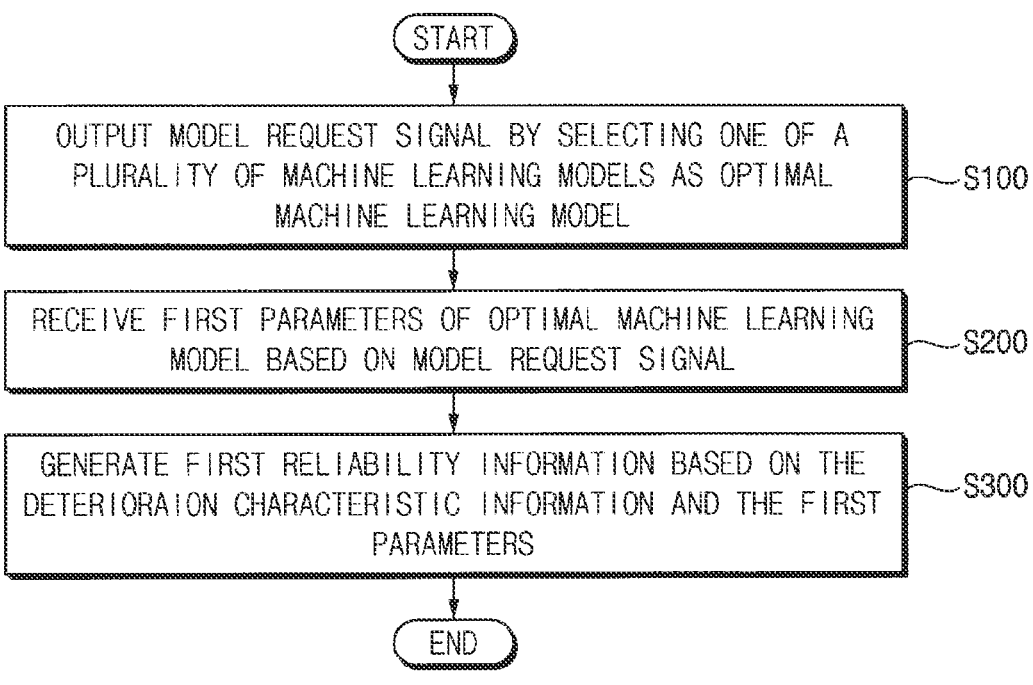
FIG. 1 is a flowchart illustrating a method of predicting reliability information of a storage device according to some example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a flowchart illustrating a method of predicting reliability information of a storage device according to some example embodiments.

Referring to FIG. 1, a method of predicting reliability information of a storage device may be performed by a storage controller configured to control a plurality of nonvolatile memories and a buffer memory. A configuration of the storage device including the storage controller, the plurality of nonvolatile memories, and the buffer memory will be described with reference to FIGS. 2 to 5.

In the method of predicting reliability information, a model request signal may be outputted by selecting one of a plurality of machine learning models as an optimal machine learning model, with the selection of the one of the plurality of machine learning models based on deterioration characteristic information and deterioration phase information (S100).

In some embodiments, the model request signal may correspond to the optimal machine learning model. The plurality of machine learning models may be used to generate first reliability information related to the plurality of nonvolatile memories. The deterioration characteristic information may be obtained by accumulating deterioration of the plurality of nonvolatile memories. The deterioration phase information may represent a degree of the deterioration of the plurality of nonvolatile memories.

In some embodiments, the deterioration characteristic information may include direct deterioration information and indirect deterioration information. For example, the direct deterioration information may include program/erase (P/E) cycles, read counts, and/or retention times for the plurality of nonvolatile memories. The indirect deterioration information may include the number of on-cells and the number of error bits for the plurality of nonvolatile memories. The direct deterioration information and the indirect deterioration information will be described with reference to FIG. 8.

In some embodiments, the deterioration phase information may represent the degree of deterioration of the plurality of nonvolatile memories as a plurality of deterioration phases. In this case, the plurality of deterioration phases may represent that the plurality of nonvolatile memories correspond to one of an early deterioration phase, a middle deterioration phase and a late deterioration phase, but this is merely an example. The deterioration phase information will be described with reference to FIG. 12.

In some embodiments, the plurality of machine learning models may be used to generate the first reliability information related to the plurality of nonvolatile memories. The plurality of machine learning models may be trained based on the same training dataset, the same verification dataset, and the same test dataset to generate various reliability information related to the plurality of nonvolatile memories.

One of the plurality of machine learning models may be selected as the optimal machine learning model. In this case, the plurality of machine learning models may be stored in separate volatile memories, and a plurality of parameters of the optimal machine learning model may be retrieved from the volatile memories based on the model request signal.

In some embodiments, the plurality of machine learning models may include a plurality of parameters, and sizes or numbers of the plurality of parameters included in the plurality of machine learning models may be different from each other. The plurality of machine learning models may be classified based on a size or number of parameters corresponding to each of the plurality of machine learning models, and parameters of each of the plurality of machine learning models may be stored into different areas of the plurality of volatile memories based on a result of the classification. The plurality of machine learning models and the optimal machine learning model will be described with reference to FIGS. 15 and 16.

First parameters of the optimal machine learning model may be received based on the model request signal (S200).

In some embodiments, the optimal machine learning model may be stored in one of the volatile memories as a machine learning model selected from among the plurality of machine learning models.

The first reliability information may be generated based on the deterioration characteristic information and the first parameters (S300).

In some embodiments, the first reliability information may be generated based on the optimal machine learning model.

In some embodiments, the deterioration characteristic information may be input as input data of the optimal machine learning model, and the first parameters may be configured as various parameters describing the optimal machine learning model.

In the method of predicting reliability information of the storage device according to example embodiments, operations S100, S200, and S300 of FIG. 1 may be performed to predict more efficiently the reliability information of the nonvolatile memories included in the storage device. The method of predicting reliability information of the storage device outputs the model request signal based on the deterioration characteristic information and the deterioration phase information, and adaptively selects an optimal machine learning model that is one of the plurality of machine learning models based on the model request signal, and thus it may be possible to predict more efficiently the reliability information of the nonvolatile memories. That is, the method of predicting the reliability information of the storage device may more efficiently predict the reliability information of the nonvolatile memories by adaptively retrieving the parameters of the optimal machine learning model in consideration of the degree of the deterioration of the nonvolatile memories.

Figure 2:
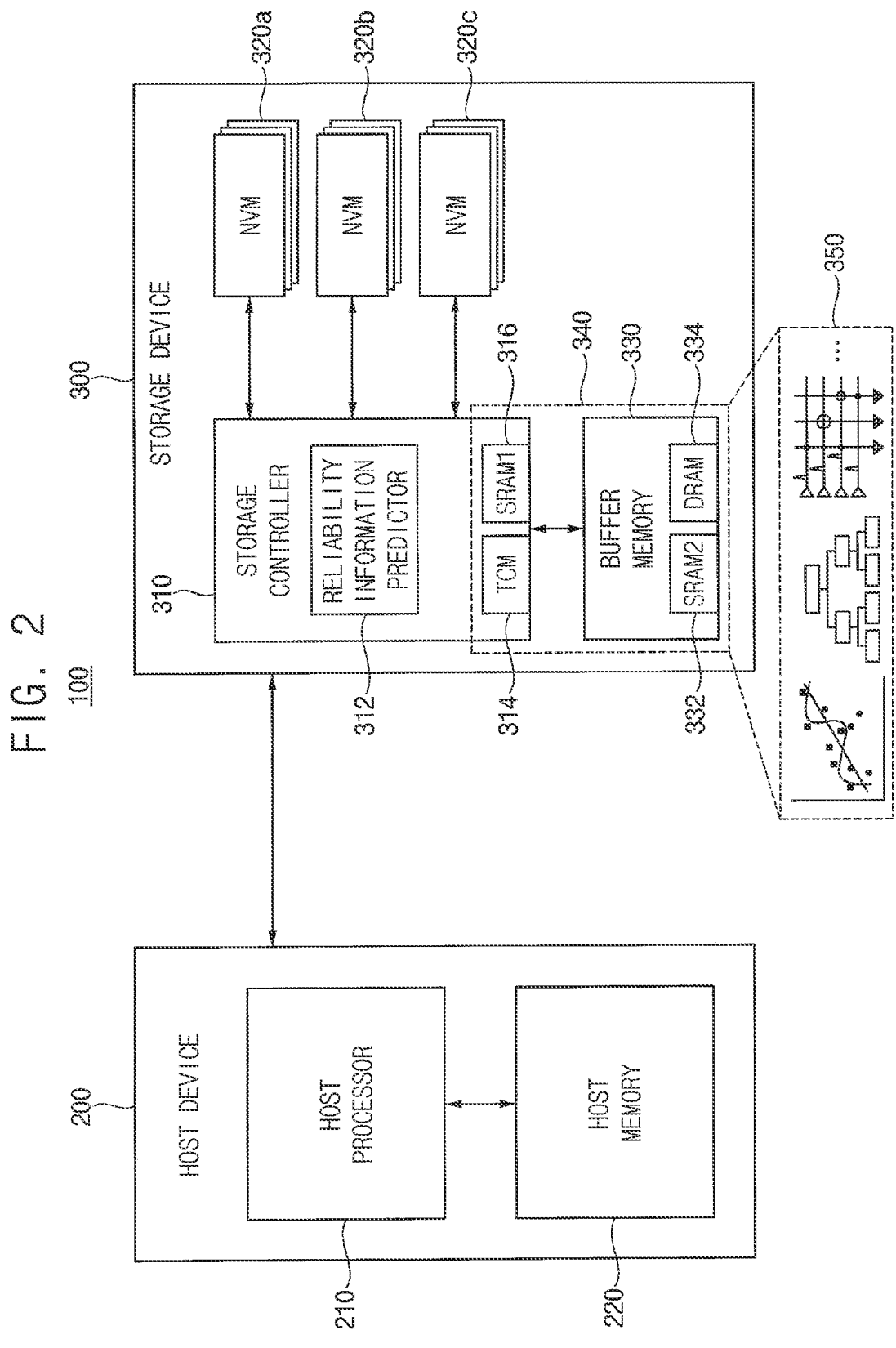
FIG. 2 is a block diagram illustrating a storage device and a storage system including the storage device according to some example embodiments.

FIG. 2 is a block diagram illustrating a storage device and a storage system including the storage device according to example embodiments.

Referring to FIG. 2, a storage system 100 may include a host device 200 and a storage device 300. The host device 200 may include a host processor 210 and a host memory 220. The storage device 300 may include a storage controller 310, a plurality of nonvolatile memories 320a, 320b and 320c, and a buffer memory 330.

The host device 200 may control overall operations of the storage system 100, and the host processor 210 may control operations of the host device 200.

In some embodiments, the host processor 210 may execute an operating system (OS). For example, the OS may include a file system for managing files and a device driver for controlling peripheral devices including the storage device 300 at an operating system level. For example, the host processor 210 may include at least one of various processing units, e.g., a central processing unit (CPU), or the like.

The host memory 220 may store instructions and/or data that are executed and/or processed by the host processor 210. For example, the host memory 220 may include at least one of various volatile memories, e.g., a dynamic random access memory (DRAM), or the like.

The storage device 300 may be accessible by the host device 200, and the storage controller 310 may control operations of the storage device 300.

In some embodiments, the storage controller 310 may control operations of the plurality of nonvolatile memories 320a, 320b and 320c based on request and data received from the host device 200.

The storage controller 310 may include a reliability information predictor 312 to predict reliability information of the storage device 300 according to some example embodiments. The reliability information predictor 312 may perform operations S100, S200 and S300 described above with reference to FIG. 1.

The buffer memory 330 may store commands and data executed and processed by the storage controller 310, and may temporarily store data stored in or to be stored in the plurality of nonvolatile memories 320a, 320b and 320c.

In some embodiments, the storage controller 310 may include a tightly-coupled memory (TCM) 314 and a first static random access memory (SRAM) 316, and the buffer memory 330 may include a second SRAM 332 and a dynamic random access memory (DRAM) 334.

In some embodiments, the plurality of machine learning models 350 described above with reference to FIG. 1 may be based on at least one of a convolution network (CNN), a recurrent neural network (RNN), a support vector machine (SVM), a linear regression, a logistic regression, a naïve bayes classification, a random forest, a decision tree and/or k-nearest neighbor (KNN) algorithms, with the present disclosure not limited thereto.

In some embodiments, the plurality of parameters of the plurality of machine learning models 350 may be stored in the TCM 314, the first SRAM 316, the second SRAM 332 and the DRAM 334. In some embodiments, the machine learning model stored in the TCM 314 may have a processing speed higher than that of the machine learning model stored in one of the first SRAM 316, the second SRAM 332 and the DRAM 334. The machine learning model stored in the DRAM 334 may have an accuracy higher than that of the machine learning model stored in one of the TCM 314, the first SRAM 316 and the second SRAM 332.

In some embodiments, sizes of the plurality of parameters included in the plurality of machine learning models 350 may be different from each other, and the plurality of machine learning models 350 may be classified into first machine learning models, second machine learning models and third machine learning models based on the sizes of the plurality of parameters. In some embodiments, the first machine learning models may be stored in the TCM 314, the second machine learning models may be stored in one of the first SRAM 316 and the second SRAM 332, and the third machine learning models may be stored in the DRAM 334.

In some embodiments, the TCM 314, the first SRAM 316, the second SRAM 332 and the DRAM 334 may be referred to as a 'learning model storage memory.'

In some embodiments, the plurality of nonvolatile memories 320a, 3420b and 320c may store a plurality of data. For example, the plurality of nonvolatile memories 320a, 320b and 320c may store metadata, other user data, or the like.

In some embodiments, each of the plurality of nonvolatile memories 320a, 320b and 320c may include a NAND flash memory. In other example embodiments, each of the plurality of nonvolatile memories 320a, 320b and 320c may include one of an electrically erasable programmable read only memory (EEPROM), a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like.

In some example embodiments, the storage device 300 may be a universal flash storage (UFS). In other example embodiments, the storage device 300 may be a solid state drive (SSD), a multi-media card (MMC), an embedded multi-media card (eMMC), or the like. In still other example embodiments, the storage device 300 may be one of a secure digital (SD) card, a micro SD card, a memory stick, a chip card, a universal serial bus (USB) card, a smart card, a compact flash (CF) card, or the like.

In some example embodiments, the storage device 300 may be connected to the host device 200 via a block accessible interface which may include, for example, a UFS, an eMMC, a serial advanced technology attachment (SATA) bus, a nonvolatile memory express (NVMe) bus, a serial attached SCSI (SAS) bus, or the like. The storage device 300 may use a block accessible address space that corresponds to an access size of the plurality of nonvolatile memories 320a, 320b and 320c to provide the block accessible interface to the host device 200, thereby allowing the access in memory-block-sized units with respect to data stored in the plurality of nonvolatile memories 320a, 320b and 320c.

In some example embodiments, the storage system 100 may be any computing system, such as a personal computer (PC), a server computer, a data center, a workstation, a digital television, a set-top box, a navigation system, etc. In other example embodiments, the storage system 100 may be any mobile system, such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

Figure 3:
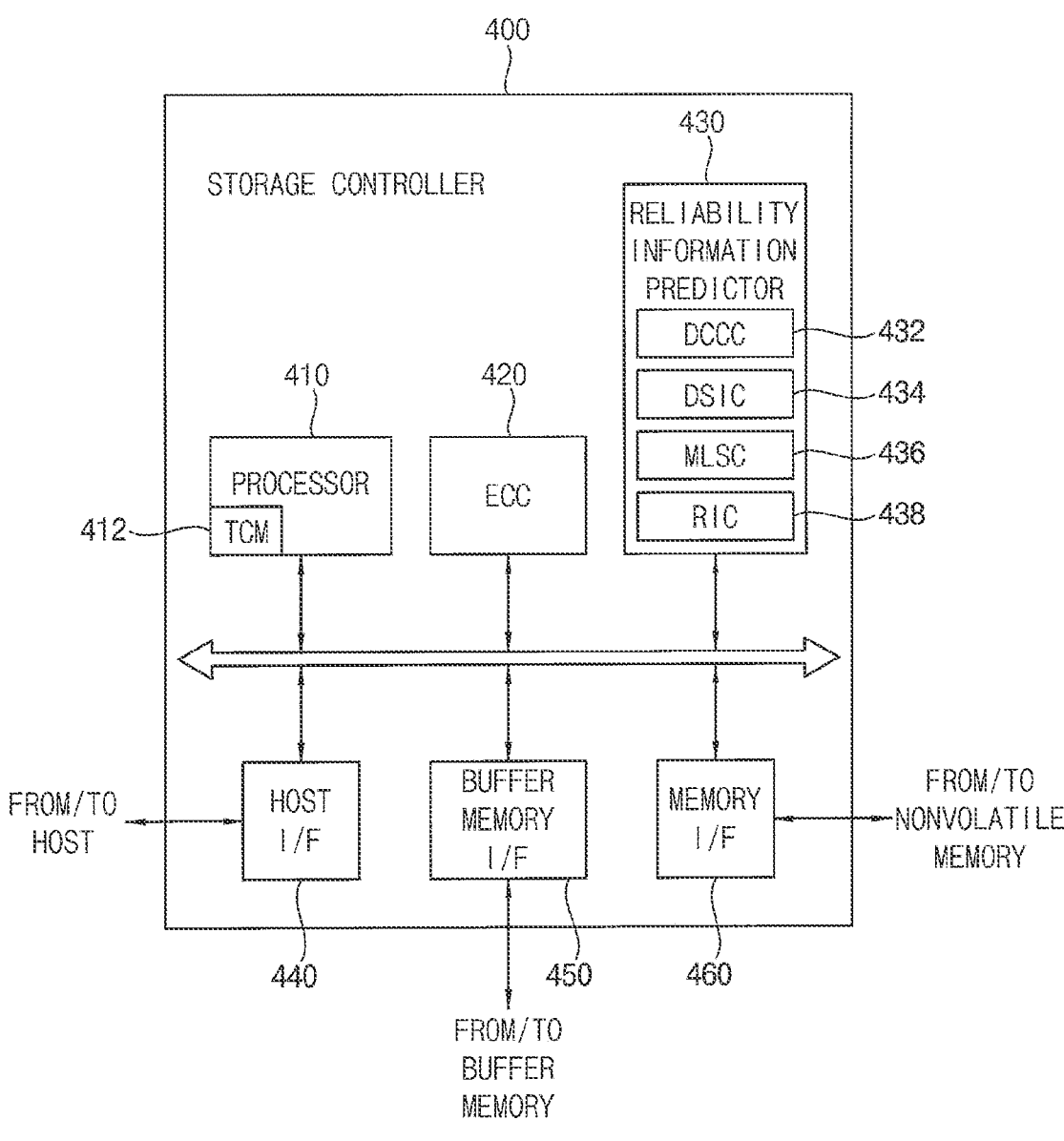
FIG. 3 is a block diagram illustrating an example of a storage controller included in the storage device in FIG. 2.

FIG. 3 is a block diagram illustrating an example of a storage controller, such as the storage controller 310 included in the storage device in FIG. 2.

Referring to FIG. 3, a storage controller 400 may include a processor 410, a TCM 412, an error correction code (ECC) engine 420, a reliability information predictor 430, a host interface 440, a buffer memory interface 450 and a memory interface 460.

The processor 410 may control overall operations of the storage controller 400 in response to requests received from the host device, e.g., 200 in FIG. 2, through the host interface 440.

In some embodiments, the processor 410 may control operations of the storage device, e.g., 300 in FIG. 2, and may control each component by employing firmware configured to drive the storage device 300.

In some embodiments, the processor 410 may include the TCM 412. The TCM 412 may correspond to the TCM 314 described above with reference to FIG. 2, and the TCM 412 may function as a cache memory capable of operating at high speed. In this case, when a separate SRAM, e.g., 316 in FIG. 2, serving as a cache memory is provided, the TCM 412 may communicate with the processor 410 through a dedicated TCM interface (not shown) that is distinct from an interface for performing communication with the SRAM.

The ECC engine 430 may be configured to perform error correction, and may perform ECC encoding and/or ECC decoding using a coded modulation such as a Bose-Chaudhuri-Hocquenghem (BCH) Code, a low density parity check (LDPC) code, a turbo code, a Reed-Solomon code, a convolution code, a recursive systematic code (RSC), a trellis-coded modulation (TCM), a block coded modulation (BCM), or other error correction codes.

The reliability information predictor 430 may perform operations S100, S200 and S300 described above with reference to FIG. 1.

In some embodiments, the reliability information predictor 430 may include a deterioration characteristic information collection circuit (DCCC) 432, a deterioration phase information generation circuit DSIC 434, a machine learning model selection circuit MLSC 436 and a reliability information generation circuit (RIC) 438, and may perform operations S100, S200 and S300 described above with reference to FIG. 1 using components 432, 434, 436 and 438 included in the reliability information predictor 430.

The host interface 440 may provide a physical connection between the host device 200 and the storage device 300. The host interface 440 may be configured to provide interfacing with the storage device 300 based on a bus format of the host device 200.

In some embodiments, the bus format of the host device 200 may be SCSI or SAS. In other example embodiments, the bus format of the host device 200 may be an USB, a peripheral component interconnect express (PCIe), ATA, PATA, SATA, NVMe, or the like.

The memory interface 460 may exchange data with nonvolatile memories, e.g., 320a, 320b and 320c in FIG. 2. The memory interface 460 may transmit data to the non-volatile memories 320a, 320b and 320c, and may receive data read from the nonvolatile memories 320a, 320b and 320c. For example, the memory interface 460 may be implemented to comply with a standard protocol such as toggle or ONFI.

Although not shown, the storage controller 400 may further include an AES engine. The AES engine may perform at least one of an encryption operation and a decryption operation on data input to the storage controller 400 using a symmetric-key algorithm. Although not shown in detail, the AES engine may include an encryption module and a decryption module. In some embodiments, the encryption module and the decryption module may be implemented as separate modules or may be implemented as a single module.

Figure 4:
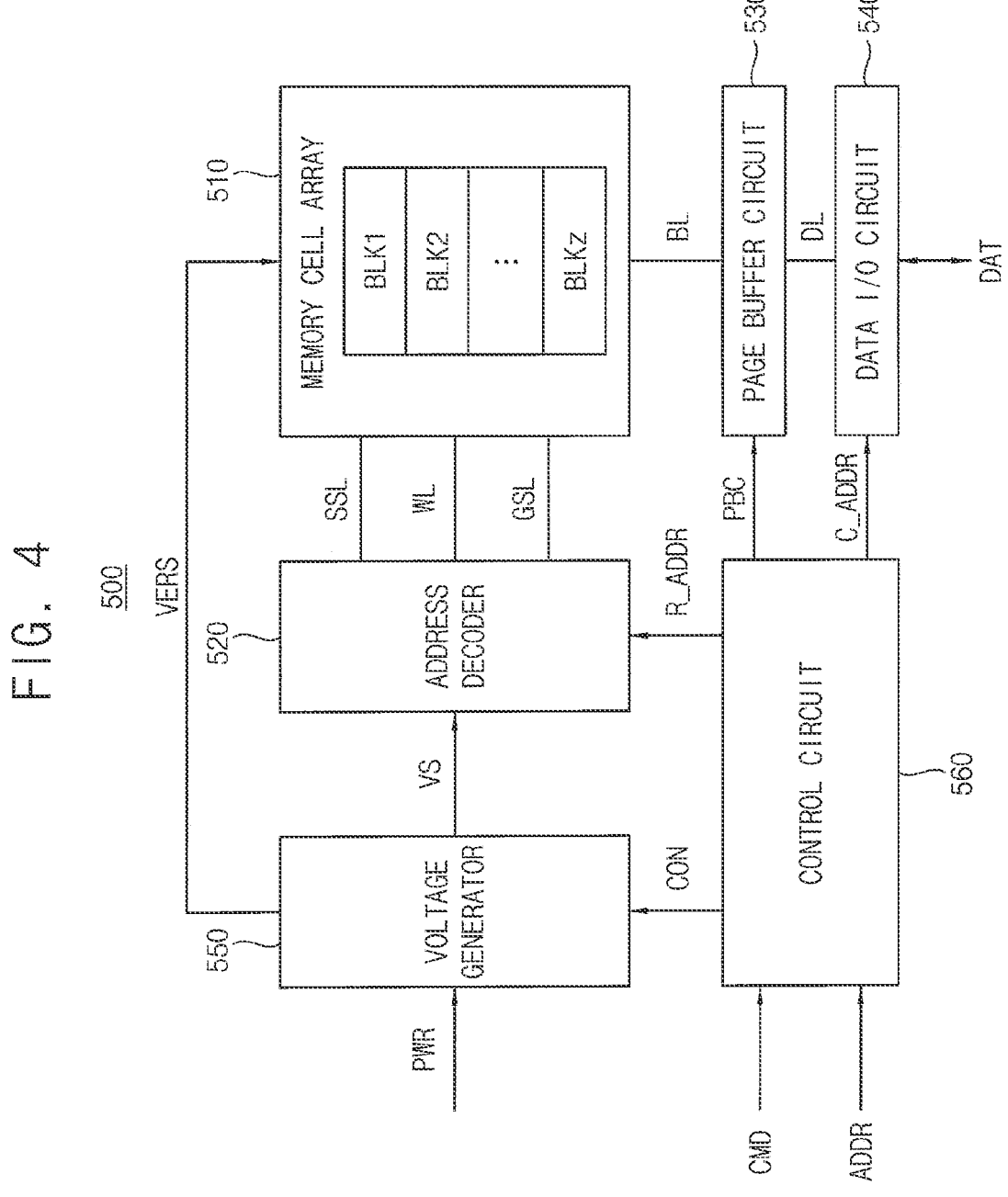
FIG. 4 is a block diagram illustrating an example of a nonvolatile memory included in the storage device in FIG. 2.

FIG. 4 is a block diagram illustrating an example of a nonvolatile memory included in the storage device in FIG. 2.

Referring to FIG. 4, a nonvolatile memory 500 includes a memory cell array 510, an address decoder 520, a page buffer circuit 530, a data I/O circuit 540, a voltage generator 550 and a control circuit 560.

The memory cell array 510 is connected to the address decoder 520 via a plurality of string selection lines SSL, a plurality of wordlines WL and a plurality of ground selection lines GSL. The memory cell array 510 is connected to the page buffer circuit 530 via a plurality of bitlines BL. The memory cell array 510 may include a plurality of memory cells (e.g., a plurality of nonvolatile memory cells) that are connected to the plurality of wordlines WL and the plurality of bitlines BL. The memory cell array 510 may be divided into a plurality of memory blocks BLK1, BLK2, . . . , BLKz each of which may include memory cells. In addition, each of the plurality of memory blocks BLK1, BLK2, . . . , BLKz may be divided into a plurality of pages.

In some example embodiments, the plurality of memory cells included in the memory cell array 510 may be arranged in a two-dimensional (2D) array structure or a three-dimensional (3D) vertical array structure. The 3D vertical array structure may include vertical cell strings that are vertically oriented such that at least one memory cell is located over another memory cell. The at least one memory cell may comprise a charge trap layer. The following documents, which are hereby incorporated by reference in their entireties, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

The control circuit 560 may be configured to receive a command CMD and an address ADDR from an outside or external source, e.g., from the storage controller 310 in FIG. 2, and configured to control erasure, programming, and read operations of the nonvolatile memory 500 based on the command CMD and the address ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 560 may generate control signals CON, which are used to control the voltage generator 550, and may generate control signal PBC to control the page buffer circuit 530, based on the command CMD, and may generate a row address R_ADDR and a column address C_ADDR based on the address ADDR. The control circuit 560 may provide the row address R_ADDR to the address decoder 520 and may provide the column address C_ADDR to the data I/O circuit 540.

The address decoder 520 may be connected to the memory cell array 510 via the plurality of string selection lines SSL, the plurality of wordlines WL and the plurality of ground selection lines GSL.

In the data erase/write/read operations, based on the row address R_ADDR the address decoder 520 may determine or select at least one of the plurality of wordlines WL as a selected wordline, and may determine or designate the rest or remainder of the plurality of wordlines WL other than the selected wordline as unselected wordlines.

In addition, in the data erase/write/read operations, based on the row address R_ADDR the address decoder 520 may determine or select at least one of the plurality of string selection lines SSL as a selected string selection line, and may determine or designate the rest or remainder of the plurality of string selection lines SSL other than the selected string selection line as unselected string selection lines.

Further, in the data erase/write/read operations, based on the row address R_ADDR the address decoder 520 may determine or select at least one of the plurality of ground selection lines GSL as a selected ground selection line, and may determine or designate the rest or remainder of the plurality of ground selection lines GSL other than the selected ground selection line as unselected ground selection lines.

The voltage generator 550 may be configured to generate voltages VS that are required for an operation of the nonvolatile memory 500 based on a power PWR and the control signals CON. The voltages VS may be applied to the plurality of string selection lines SSL, the plurality of wordlines WL and the plurality of ground selection lines GSL via the address decoder 520. In addition, the voltage generator 550 may generate an erase voltage VERS that is required for the data erase operation based on the power PWR and the control signals CON. The erase voltage VERS may be applied to the memory cell array 510 directly or via the bitline BL.

During the erase operation, the voltage generator 550 may apply the erase voltage VERS to a common source line and/or the bitline BL of a memory block, e.g., a selected memory block, and may apply an erase permission voltage, e.g., a ground voltage, to all wordlines of the memory block or a portion of the wordlines via the address decoder 520. In addition, during the erase verification operation, the voltage generator 550 may apply an erase verification voltage simultaneously to all wordlines of the memory block or sequentially to the wordlines one by one.

During the program operation, the voltage generator 550 may apply a program voltage to the selected wordline and may apply a program pass voltage to the unselected wordlines via the address decoder 520. In addition, during the program verification operation, the voltage generator 550 may apply a program verification voltage to the selected wordline and may apply a verification pass voltage to the unselected wordlines via the address decoder 520.

In addition, during the normal read operation, the voltage generator 550 may apply a read voltage to the selected wordline and may apply a read pass voltage to the unselected wordlines via the address decoder 520. During the data recover read operation, the voltage generator 550 may apply the read voltage to a wordline adjacent to the selected wordline and may apply a recover read voltage to the selected wordline via the address decoder 520.

The page buffer circuit 530 may be connected to the memory cell array 510 via the plurality of bitlines BL. The page buffer circuit 530 may include a plurality of page buffers. In some example embodiments, each page buffer may be connected to one bitline. In other example embodiments, each page buffer may be connected to two or more bitlines.

The page buffer circuit 530 may store data DAT to be programmed into the memory cell array 510 and/or may read data DAT sensed from the memory cell array 510. In other words, the page buffer circuit 530 may operate as a write driver and/or as a sensing amplifier according to an operation mode of the nonvolatile memory 500.

The data I/O circuit 540 may be connected to the page buffer circuit 530 via data lines DL. The data I/O circuit 540 may provide the data DAT from an outside source of the nonvolatile memory 500 to the memory cell array 510 via the page buffer circuit 530 or may provide the data DAT from the memory cell array 510 to an outside destination of the nonvolatile memory 500, based on the column address C_ADDR. In some embodiments, the outside source and the outside destination may be the same location or device.

Although the nonvolatile memory according to some example embodiments is described based on a NAND flash memory, the nonvolatile memory according to example embodiments may be any nonvolatile memory, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), or the like.

Figure 5:
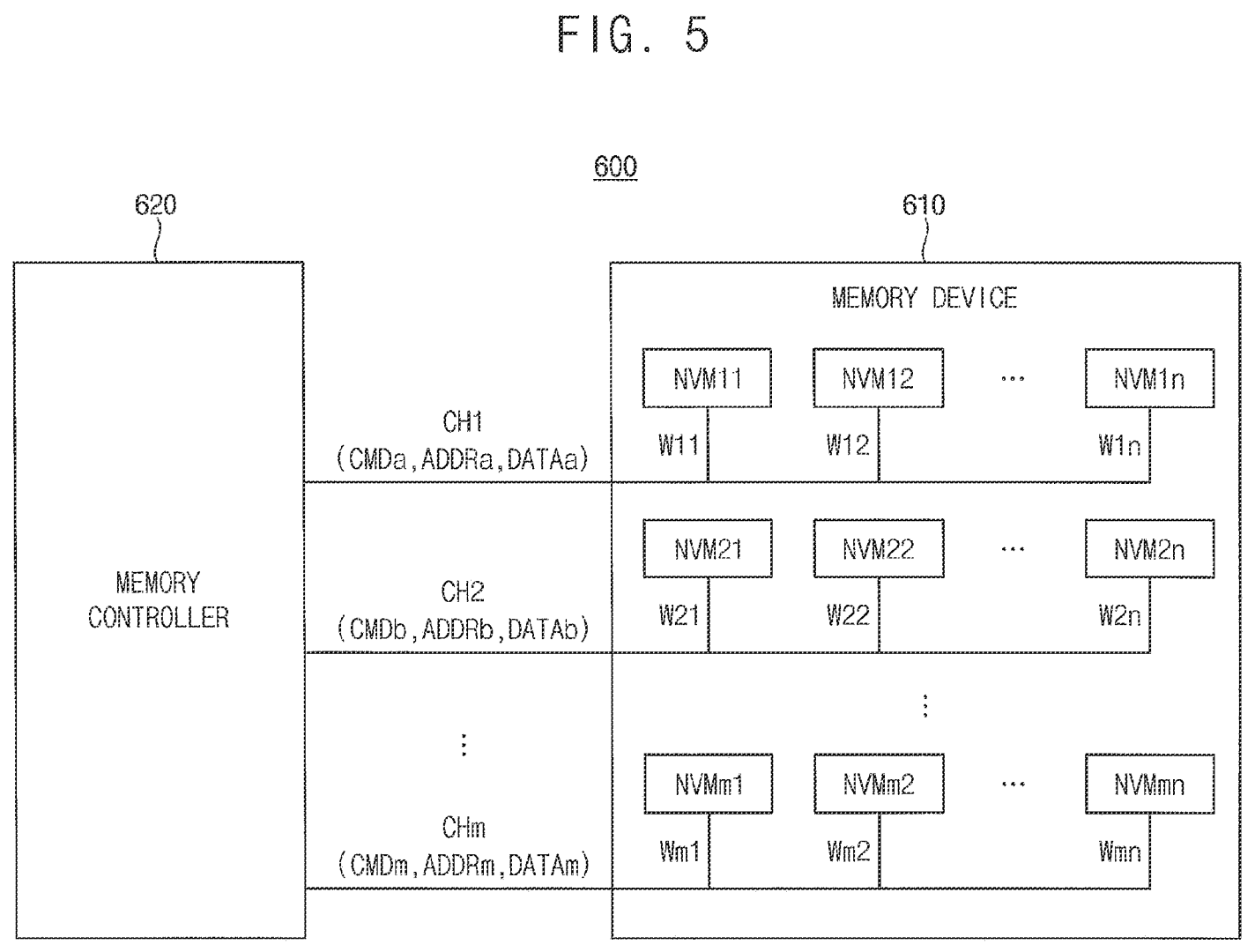

FIG. 5 is a block diagram illustrating a nonvolatile memory and a memory system including the nonvolatile memory according to some example embodiments.

Referring to FIG. 5, a memory system 600 may include a memory device 610 and a memory controller 620. The memory system 600 may support a plurality of channels CH1, CH2, . . . , CHm, and the memory device 610 may be connected to the memory controller 620 through the plurality of channels CH1 to CHm. For example, the memory system 600 may be implemented as a storage device, such as a universal flash storage (UFS), a solid state drive (SSD), or the like.

The memory device 610 may include a plurality of nonvolatile memories NVM11, NVM12, . . . , NVM1$n$, NVM21, NVM22, . . . , NVM2$n$, NVMm1, NVMm2, . . . , NVMmn. For example, the nonvolatile memories NVM11 to NVMmn may correspond to the nonvolatile memories 320$a$, 320$b$ and 320$c$ in FIG. 2. Each of the nonvolatile memories NVM11 to NVMmn may be connected to one of the plurality of channels CH1 to CHm through a way corresponding thereto. For instance, the nonvolatile memories NVM11 to NVM1$n$ may be connected to the first channel CH1 through ways W11, W12, . . . , W1$n$, the nonvolatile memories NVM21 to NVM2$n$ may be connected to the second channel CH2 through ways W21, W22, . . . , W2$n$, and the nonvolatile memories NVMm1 to NVMmn may be connected to the m-th channel CHm through ways Wm1, Wm2, . . . , Wmn. In some example embodiments, each of the nonvolatile memories NVM11 to NVMmn may be implemented as an arbitrary memory unit that may operate according to an individual command from the memory controller 620. For example, each of the nonvolatile memories NVM11 to NVMmn may be implemented as a chip or a die, but the present disclosure is not limited thereto.

The memory controller 620 may transmit and receive signals to and from the memory device 610 through the plurality of channels CH1 to CHm. For example, the memory controller 620 may correspond to the storage controller 310 in FIG. 2. For example, the memory controller 620 may transmit commands CMDa, CMDb, . . . , CMDm, addresses ADDRa, ADDRb, . . . , ADDRm and data DATAa, DATAb, . . . , DATAm to the memory device 610 through the channels CH1 to CHm or may receive the data DATAa to DATAm from the memory device 610.

The memory controller 620 may select one of the nonvolatile memories NVM11 to NVMmn, which is connected to each of the channels CH1 to CHm, by using a corresponding one of the channels CH1 to CHm, and may transmit and receive signals to and from the selected nonvolatile memory. For example, the memory controller 620 may select the nonvolatile memory NVM11 from among the nonvolatile memories NVM11 to NVM1$n$ connected to the first channel CH1. The memory controller 620 may transmit the command CMDa, the address ADDRa and the data DATAa to the selected nonvolatile memory NVM11 through the first channel CH1 or may receive the data DATAa from the selected nonvolatile memory NVM11.

The memory controller 620 may transmit and receive signals to and from the memory device 610 in parallel through different channels. For example, the memory controller 620 may transmit the command CMDb to the memory device 610 through the second channel CH2 while transmitting the command CMDa to the memory device 610 through the first channel CH1. For example, the memory controller 620 may receive the data DATAb from the memory device 610 through the second channel CH2 while receiving the data DATAa from the memory device 610 through the first channel CH1.

The memory controller 620 may control overall operations of the memory device 610. The memory controller 620 may transmit a signal to the channels CH1 to CHm and may control each of the nonvolatile memories NVM11 to NVMmn connected to the channels CH1 to CHm. For example, the memory controller 620 may transmit the command CMDa and the address ADDRa to the first channel CH1 and may control one selected from among the nonvolatile memories NVM11 to NVM1$n$.

Each of the nonvolatile memories NVM11 to NVMmn may operate under the control of the memory controller 620. For example, the nonvolatile memory NVM11 may program the data DATAa based on the command CMDa, the address ADDRa, and the data DATAa provided from the memory controller 620 through the first channel CH1. For example, the nonvolatile memory NVM21 may read the data DATAb based on the command CMDb and the address ADDRb provided from the memory controller 620 through the second channel CH2 and may transmit the read data DATAb to the memory controller 620 through the second channel CH2.

Although FIG. 5 illustrates an example where the memory device 610 communicates with the memory controller 620 through m channels and includes n nonvolatile memories corresponding to each of the channels, the present disclosure is not limited thereto, and the number of channels and the number of nonvolatile memories connected to one channel may be variously changed according to example embodiments.

Figure 6:
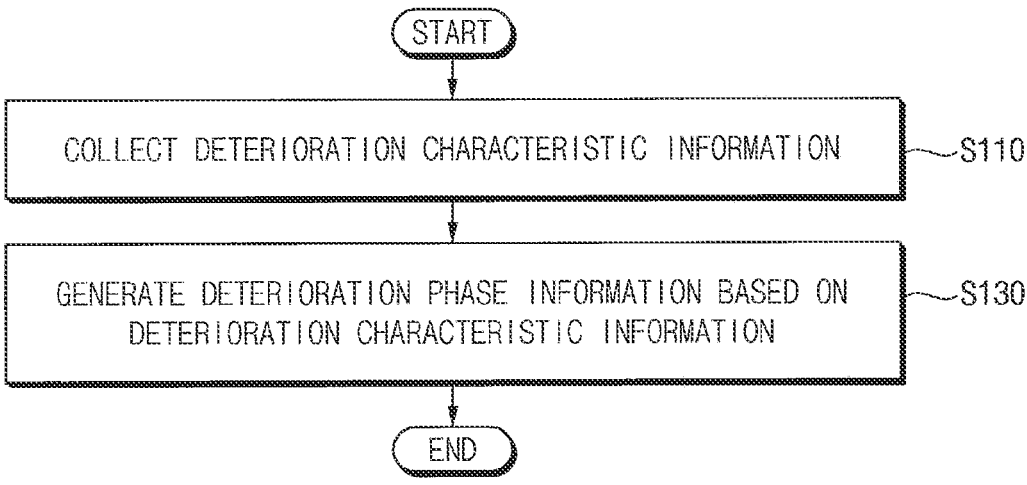
FIG. 6 is a flowchart illustrating an example of outputting the model request signal in FIG. 1.
Figure 7:
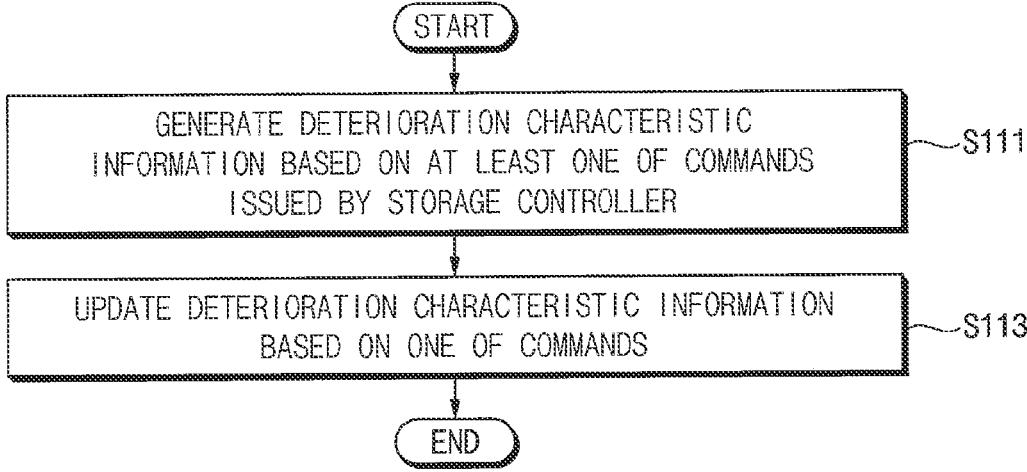
FIG. 7 is a flowchart illustrating an example of collecting the deterioration characteristic information in FIG. 6.

FIG. 6 is a flowchart illustrating an example of outputting the model request signal in FIG. 1. FIG. 7 is a flowchart illustrating an example of collecting the deterioration characteristic information in FIG. 6.

Referring to FIG. 6, in outputting the model request signal, deterioration characteristic information may be collected (S110). Deterioration phase information may be generated based on the deterioration characteristic information (S130). In some embodiments, the deterioration phase information may represent a degree of a deterioration of a plurality of nonvolatile memories as a plurality of deterioration phases.

Referring to FIG. 7, in collecting the deterioration characteristic information, the deterioration characteristic information is generated based on at least one of commands issued by a storage controller included in the storage device (S111). The deterioration characteristic information is updated based on at least one of the commands (S113).

In some embodiments, the deterioration characteristic information may include direct deterioration information and indirect deterioration information. Hereinafter, the deterioration characteristic information will be described.

Figure 9:
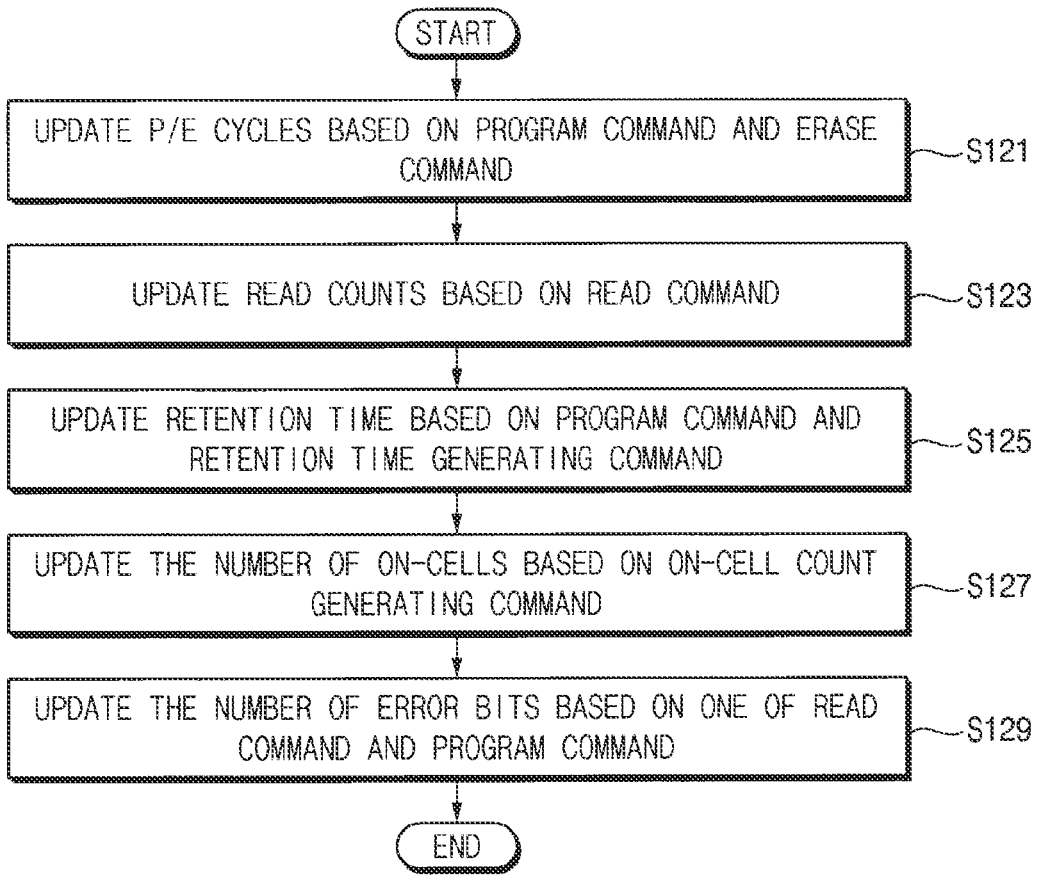
Figure 10:
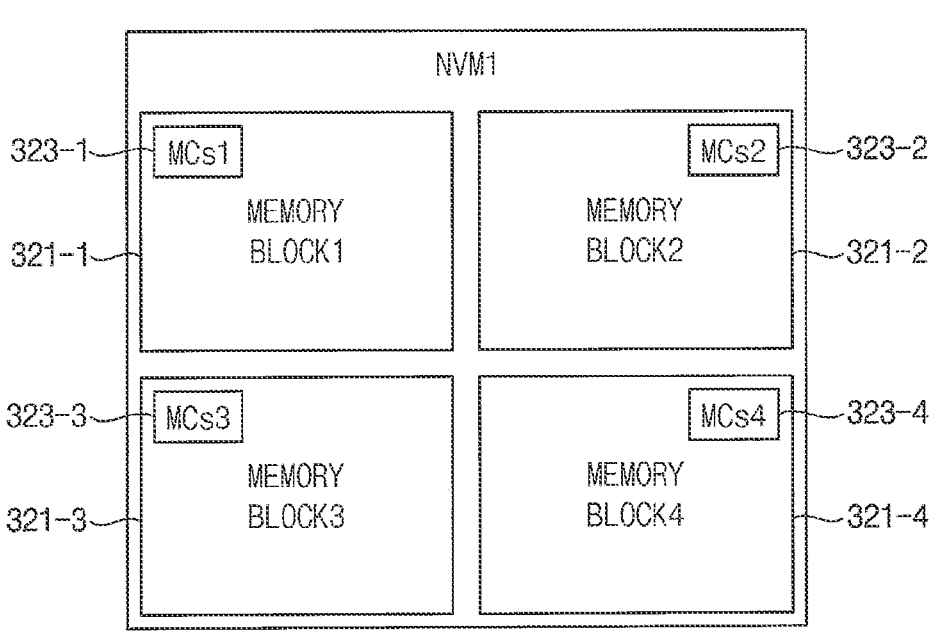

FIGS. 8, 9 and 10 are diagrams for describing a process of generating the deterioration characteristic information in FIG. 6.

In FIG. 8, and as examples, commands issued from a storage controller, P/E cycles, read counts, a retention time, the number of on-cells and the number of error bits for a plurality of nonvolatile memories are illustrated.

In some embodiments, P/E cycle information, read count information, retention time information, information on the number of on-cells, and information on the number of error bits may be generated by cumulatively counting the P/E cycle, the read counts, the number of on-cells and the number of error bits.

In some embodiments, the P/E cycle, the read counts, and the retention time may be included in direct deterioration information, and the number of on-cells and the number of error bits may be included in indirect deterioration information.

Referring to FIG. 8, for convenience of description, it is assumed that a program command PGM, a first read command RD1, a second read command RD2, an erase command ERS, a retention time generating command RTIC, and on-cell count generating command OCIC are sequentially issued.

In some embodiments, the number of P/E cycles may be cumulatively counted based on the program command PGM and the erase command ERS. For example, whenever the program command PGM and the erase command ERS corresponding to the program command PGM are issued, the number of program/erase cycles may be cumulatively increased. In this case, a first variable CI1 for storing the number of P/E cycles may be generated or read according to the program command PGM, and a value of the first variable CI1 may increase by one or incremented based on the erase command ERS.

In some embodiments, the number of read counts may be cumulatively counted based on the read command. For example, the number of read counts may be cumulatively increased when the first read command RD1 is issued, and the number of reads may be cumulatively increased when the second read command RD2 is issued. In this case, the second variable CI2 for storing the read counts may be generated or read according to the first read command RD1 and the second read command RD2, and a value of the second variable CI2 may increase by one or incremented based on the first read command RD1 and the second read command RD2.

In some embodiments, the retention time may be cumulatively counted based on the program command PGM and the retention time generating command RTIC. For example, when the program command PGM is issued, the third variable CI3 for storing the retention time may be generated corresponding to the program command PGM. When the retention time generating command RTIC is issued, a value of the third variable CI3 for storing the retention time may be increased by time from when the program command PGM is issued until the retention time generating command RTIC is issued.

In some embodiments, the number of on-cells may be cumulatively counted based on the on-cell count generating command OCIC. For example, when the on-cell count generating command OCIC is issued, the number of on-cells among the memory cells included in the plurality of non-volatile memories is counted, and a value of the fourth variable CI4 for storing the number of on-cells may be increased by the counted number of on-cells.

In some embodiments, the number of error bits may be cumulatively counted based on the program command PGM and the read command RD1 and RD2. For example, whenever the program command PGM, the first read command RD1 and the second read command RD2 are issued, the number of error bits may be cumulatively increased. In this case the fifth variable CI5 for storing the number of error bits may be increased by the number of error bits according to results of performing ECC encoding or ECC decoding on data corresponding to the program command PGM, the first read command RD1 and the second read command RD2, respectively.

In some embodiments, the P/E cycle information, the read counts information, the retention time information, the information on the number of on-cells, and the information on the number of error bits may be generated based on the first to fifth variables CI1 to CI5. Referring to FIGS. 6, 8 and 9, in collecting the deterioration characteristic information (S110), the P/E cycles may be updated based on the program command PGM and the erase command ERS (S121), and the read counts may be updated based on the first read command RD1 and the second read command RD2 (S123). The retention time may be updated based on the program command PGM and the retention time generating command RTIC (S125), the number of on-cells may be updated based on the on-cell count generating command OCIC (S127), and the number of error bits may be updated based on at least one of the first read command RD1, the second read command RD2 and the program command PGM (S129).

In FIG. 10, a first nonvolatile memory 320*a* of the plurality of nonvolatile memories 320*a*, 320*b* and 320*c* described above with reference to FIG. 2 is illustrated as an example.

The first nonvolatile memory 320*a* may include a plurality of memory blocks 321-1, 321-2, 321-3 and 321-4, and each of the plurality of memory blocks 321-1, 321-2, 321-3 and 321-4 may include a plurality of memory cells 323-1, 323-2, 323-3 and 323-4. Only some of the memory blocks 321 and memory cells 323 therein are shown in FIG. 10 for ease of illustration.

Referring to FIG. 10, the P/E cycles, the read counts, the retention time, the number of on-cells and the number of error bits may be generated for the first nonvolatile memory 320*a*. In some embodiments, the P/E cycles, the read counts, the retention time, the number of on-cells and the number of error bits may be generated for all or a portion of the plurality of memory blocks 321-1, 321-2, 321-3 and 321-4, and in other example embodiments, the read counts, the retention time, the number of on-cells and the number of error bits may be generated for all or a portion of the plurality of memory cells 323-1, 323-2, 323-3 and 323-4.

In some embodiments, the deterioration characteristic information may be stored in the plurality of nonvolatile memories 320*a*, 320*b* and 320*c* or in the DRAM 334 in the buffer memory 330 described above with reference to FIG. 2, but the present disclosure is not limited thereto.

FIG. 11 is a flowchart illustrating an example of generating deterioration phase information in FIG. 6. FIG. 12 is a diagram illustrating an example of a lookup table representing a relationship between the deterioration characteristic information and a plurality of deterioration phases.

Referring to FIG. 11, deterioration characteristic information may be retrieved (S131), and a lookup table representing a relationship between the deterioration characteristic information and the plurality of deterioration phases is retrieved (S133). A deterioration phase information may be generated based on the deterioration characteristic information and the lookup table (S135).

In FIG. 12, the deterioration characteristic information DCI_INFO and the deterioration phase information DSI_INFO are illustrated. Referring to FIG. 12, the deterioration characteristic information DCI_INFO may be generated by interpolating values accumulated in the first to fifth variables CI1 to CI5 described above with reference to FIGS. 8, 9 and 10 based on predetermined coefficients.

In some embodiments, the deterioration characteristic information DCI_INFO may be represented by one of the first to tenth deterioration characteristic information DCI_INFO_1 to DCI_INFO_10 based on a result of the interpolation, and one the first to tenth deterioration characteristic information DCI_INFO_1 to DCI_INFO_10 may be represented as one of the first to tenth deterioration phases DSI_INFO_1 to DSI_INFO_10.

In some embodiments, the deterioration phase information may represent a degree of the deterioration of a plurality of nonvolatile memories as a plurality of deterioration phases. For example, the first deterioration phase DSI_INFO_1 may represent a case in which the deterioration of the plurality of nonvolatile memories has progressed the least, and the tenth deterioration phase DS_INFO_10 may represent a case in which the deterioration of the plurality of nonvolatile memories has progressed the most. The present disclosure is not limited thereto.

In some embodiments, when the plurality of nonvolatile memories correspond to one of the first to third deterioration phases DSI_INFO_1 to DSI_INFO_3, it may be determined that the plurality of nonvolatile memories corresponds to or is in an early deterioration phase. When the plurality of nonvolatile memories correspond to one of the fourth to sixth deterioration phases DSI_INFO_4 or DSI_INFO_6, it may be determined that the plurality of nonvolatile memories corresponds to or is in a middle deterioration phases. When the plurality of nonvolatile memories corresponds to one of the seventh to tenth deterioration phases DSI_INFO_7 to DSI_INFO_10, it may be determined that the plurality of nonvolatile memories corresponds to or is in a late deterioration phase. However, example embodiments are not limited thereto.

Figure 13:
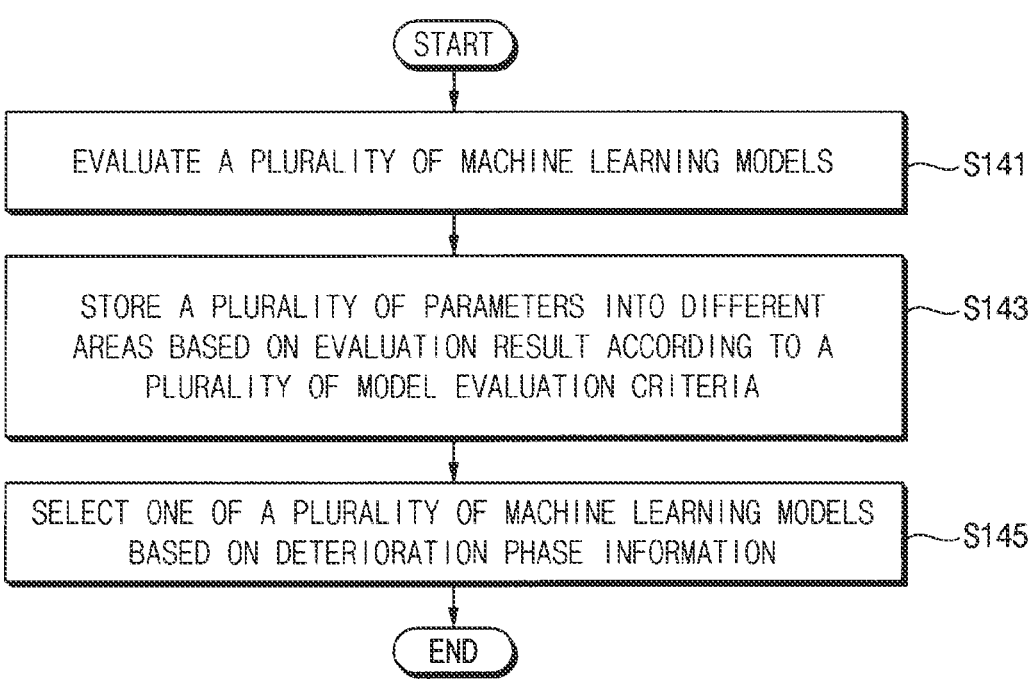
FIG. 13 is a flowchart illustrating an example of outputting a model request signal in FIG. 1.
Figure 15:
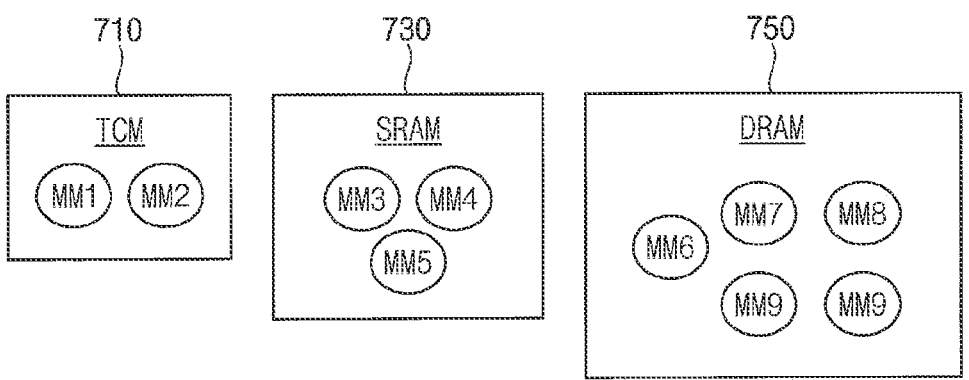
FIG. 15 is a diagram for describing a process of storing a plurality of parameters included in a plurality of machine learning models into different areas of a plurality of volatile memories included in the storage device.

FIG. 13 is a flowchart illustrating an example of outputting a model request signal in FIG. 1. FIG. 14 is a diagram illustrating an example of an evaluation result obtained by evaluating a plurality of machine learning models according to a plurality of model evaluation criteria. FIG. 15 is a diagram for describing a process of storing a plurality of parameters included in a plurality of machine learning models into different areas of a plurality of volatile memories included in the storage device.

Referring to FIG. 13, in outputting the model request signal in FIG. 1, a plurality of machine learning models may be evaluated according to a plurality of model evaluation criteria (S141).

In FIG. 14, an evaluation result obtained by evaluating a plurality of machine learning models MM1 to MM10 according to a plurality of model evaluation criteria is illustrated. In some embodiments, the plurality of model evaluation criteria may include a processing speed, an accuracy, a confusion matrix, a precision, a recall and a F1 score, with the present disclosure not limited thereto.

Referring to FIG. 14, the plurality of machine learning models may be evaluated according to at least one of the plurality of model evaluation criteria.

In some embodiments, as a result of evaluating the plurality of machine learning models MM1 to MM10 according to the processing speed, the machine learning model MM1 may be identified to be the best or most optimal and the machine learning model MM10 may be the worst or least optimal.

In some embodiments, as a result of evaluating the plurality of machine learning models MM1 to MM10 according to the accuracy, the machine learning model MM10 may be identified to the best or most optimal and the machine learning model MM1 may be the worst or least optimal.

In some embodiments, as a result of evaluating the plurality of machine learning models MM1 to MM10 according to the error matrix, the precision, the recall and the F1 score, the plurality of machine learning models MM1 to MM10 may be identified as illustrated in FIG. 14.

In some embodiments, the plurality of model evaluation criteria may include first to X-th model evaluation criteria, where X is an integer greater than or equal to two. Each of the first to X-th model evaluation criteria may be a criterion for sorting the plurality of machine learning models based on at least one of the processing speed, the accuracy, a confusion matrix, a precision, a recall and a F1 score of the plurality of machine learning models.

Referring back to FIG. 13, a plurality of parameters included in the plurality of machine learning models may be stored into different area of a plurality of volatile memories included in the storage device based on the evaluation result according to the plurality of model evaluation criteria (S143). One of the plurality of machine learning models is selected based on the deterioration phase information (S145).

Referring to FIG. 15, a plurality of machine learning models MM1 to MM10 are stored in a plurality of volatile memories 710, 730 and 750 included in a storage device.

In some embodiments, a first volatile memory 710 of the plurality of volatile memories may correspond to the TCM 314 in FIG. 2. A second volatile memory 730 of the plurality of volatile memories may correspond to one of the SRAM 316 and SRAM 332 in FIG. 2. A third volatile memory 750 of the plurality of volatile memories may correspond to the DRAM 334 in FIG. 2.

In some embodiments, some or a first group of the machine learning models, e.g., MM1 and MM2, with excellent processing speed may be stored in the first volatile memory 710, some or a second group of the machine learning models, e.g., MM3 to MMS, with the next best processing speed may be stored in the second volatile memory 730, and the remaining or a third group of the machine learning models, e.g., MM6 to MM10, with inferior processing speed may be stored in the third volatile memory 750. The machine learning models stored in the first volatile memory 710 may be referred to as first machine learning models, the machine learning models stored in the second volatile memory 730 may be referred to as second machine learning models, and the machine learning models stored in the third volatile memory 750 may be referred to as third machine learning models. In some embodiments, a size or number of the plurality of parameters included in the first machine learning model is smaller than a size or number of the plurality of parameters included in the second machine learning model, and the size or number of the plurality of parameters included in the second machine learning model is smaller than a size or number of the plurality of parameters included in the third machine learning model.

In some embodiments, machine learning models based on a linear regression expressed as a first-order polynomial, a linear SVM, a shallow depth decision tree and an artificial neural network composed of a small number of layers and nodes may be stored in the first volatile memory 710. Machine learning models based on a linear regression expressed as an exponential or a logarithmic, a SVM based on radial basis function (RBF) kernel, a deep depth decision tree and an artificial neural network composed of a large number of layers and nodes may be stored in the third volatile memory 750.

Therefore, when it is determined based on the deterioration phase information that the plurality of nonvolatile memories correspond to an early deterioration phase, the first machine learning model may be selected from among the plurality of machine learning models as an optimal machine learning model. When it is determined based on the deterioration phase information that the plurality of nonvolatile memories correspond to a middle deterioration phase, the second machine learning model may be selected from among the plurality of machine learning models as the optimal machine learning model. When it is determined based on the deterioration phase information that the plurality of nonvolatile memories correspond to a late deterioration phase, the third machine learning model may be selected from among the plurality of machine learning models as the optimal machine learning model.

Figure 16:
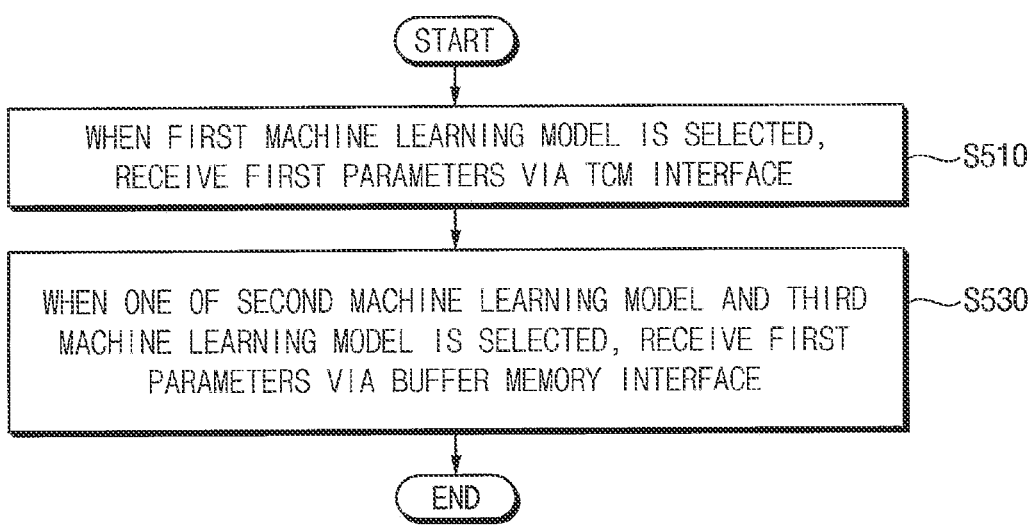
FIG. 16 is a flowchart illustrating an example of receiving first parameters of the optimal machine learning model in FIG. 1.

FIG. 16 is a flowchart illustrating an example of receiving first parameters of the optimal machine learning model in FIG. 1.

Referring to FIG. 16, in receiving the first parameters of the optimal machine learning mode in FIG. 1, when a first machine learning model is selected as the optimal machine learning model, the first parameters may be received via a TCM interface (S510). When one of the second machine learning model and the third machine learning model is selected as the optimal machine learning model, the first parameters may be received via a buffer memory interface (S530).

In some embodiments, when a machine learning model is selected as the optimal machine learning model by performing operations S510 and S530, the first parameters may be received from one of the first volatile memory 710, the second volatile memory 730, and the third volatile memory 750 described above with reference to FIG. 15. When the first machine learning model is selected as the optimal machine learning model, the first parameters may be received from the first volatile memory 710. When the second machine learning model is selected as the optimal machine learning model, the first parameters may be received from the second volatile memory 730. When the third machine learning model is selected as the optimal machine learning model, the first parameters may be received from the third volatile memory 750.

Figure 17:
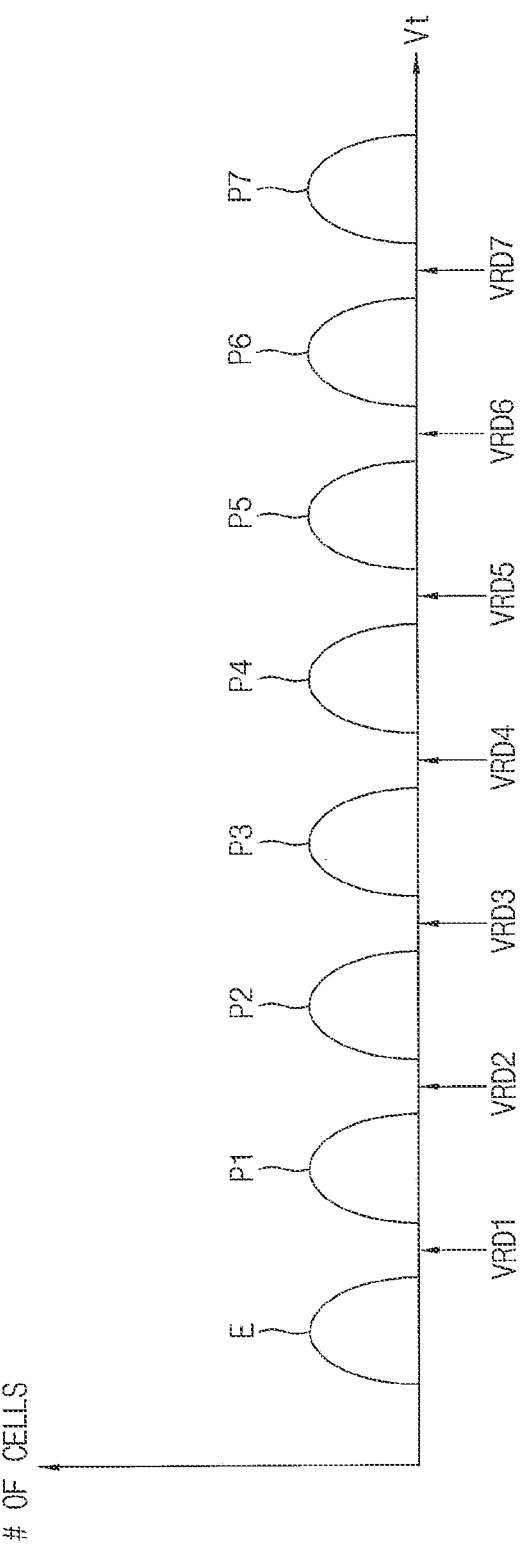
FIGS. 17 and 18 are diagrams for describing threshold voltages and read voltages of the nonvolatile memory included in the storage device according to some example embodiments.
Figure 18:
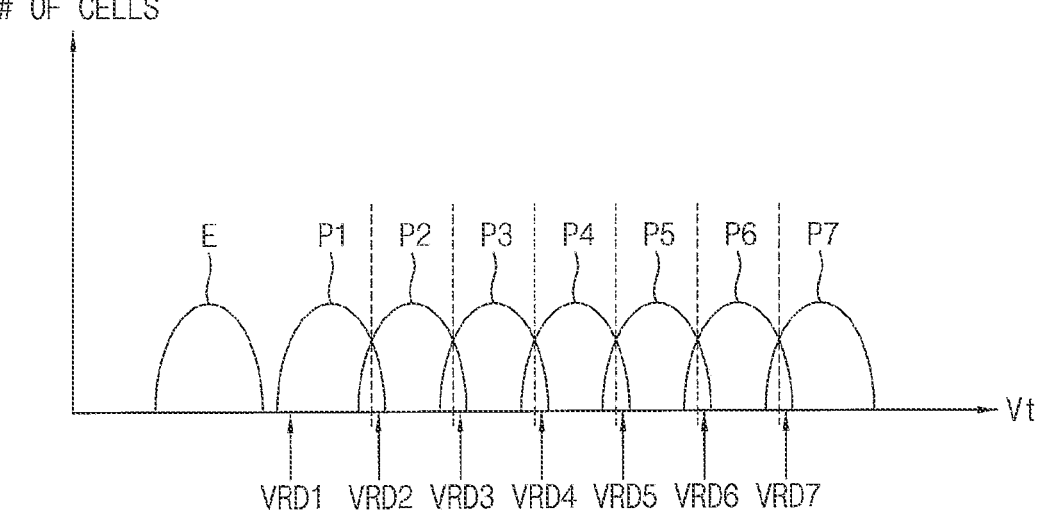

FIGS. 17 and 18 are diagrams for describing threshold voltages and read voltages of the nonvolatile memory included in the storage device according to some example embodiments.

In FIGS. 17 and 18, threshold voltage distributions and read voltages of a nonvolatile memory device including memory cells having a triple level cell (TLC) structure are illustrated in an example.

Referring to FIG. 17, memory cells included in the nonvolatile memory device may have one of an erase state E and first to seventh program states P1 to P7. The read voltages VRD1 to VRD7 may be predetermined in consideration of characteristics of the memory cells.

In some embodiments, the read voltages VRD1 to VRD7 may be determined based on the threshold voltage distribution immediately after the memory cells are programmed, but in other example embodiments, after a predetermined time elapses subsequent to the memory cells being programmed, e.g., after the memory cells are stabilized, the read voltages VRD1 to VRD7 may be determined based on the threshold voltage distribution.

Referring to FIG. 18, when physical characteristics of memory cells included in the nonvolatile memory device are changed due to external factors, the threshold voltage distribution may be changed as illustrated in FIG. 18. For example, in a charge trap flash (CTF) memory cell, an initial verify shift (IVS) phenomenon in which a threshold voltage distribution of the memory cells decreases as a programming time elapses may occur. Furthermore, the threshold voltage distribution of the memory cells may overlap as illustrated in FIG. 18 due to sudden power off (SPO) during programming of the memory cells. When the data stored in the nonvolatile memory device is retrieved based on the read voltages VRD1 to VRD7, the read data may include a plurality of errors. Accordingly, when threshold voltages or read voltages of nonvolatile memories are predicted using the machine learning models described above with reference to FIG. 1, a number of errors that may be included in the read data may be effectively reduced.

Figure 19:
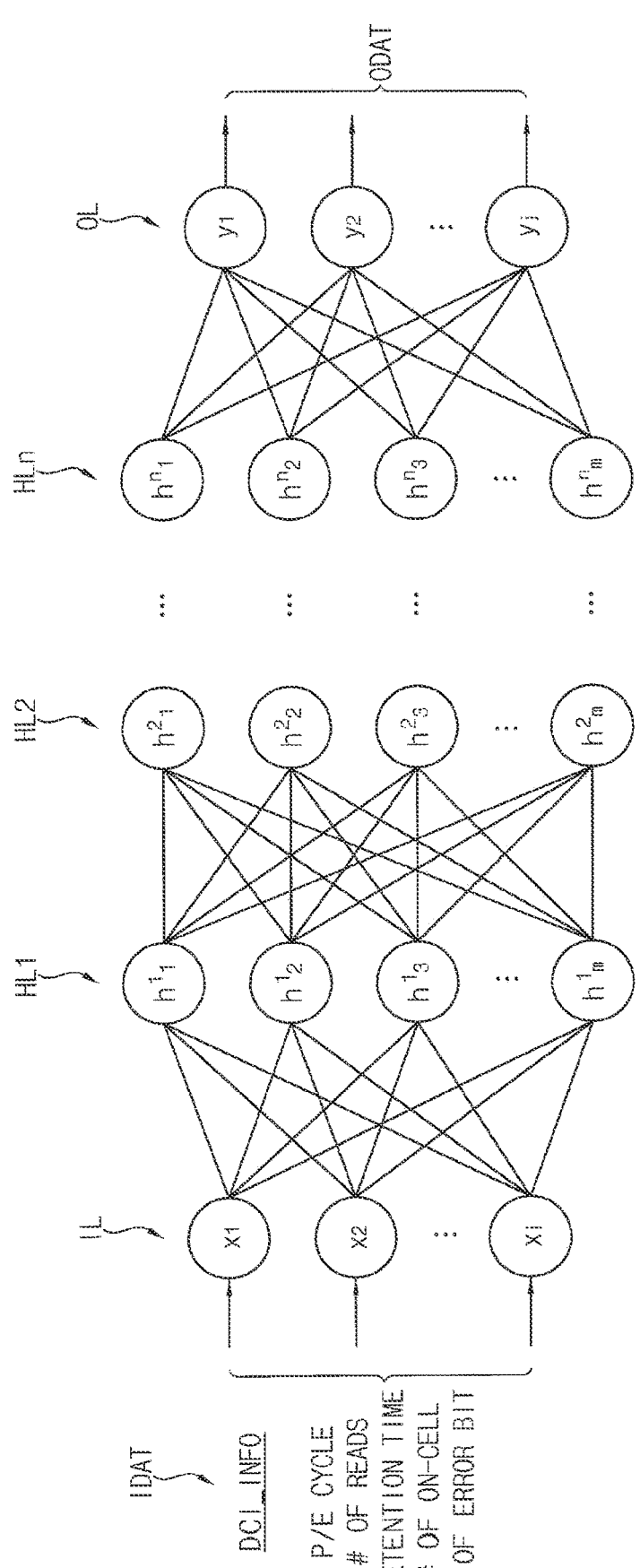
Figure 21:
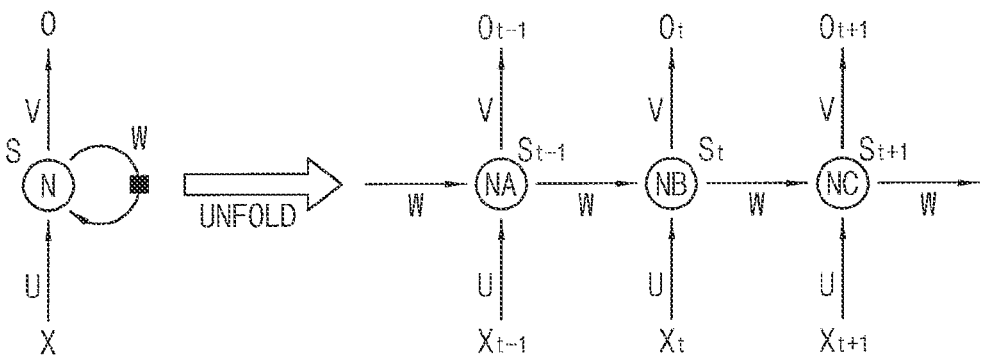

FIGS. 19, 20, and 21 are diagrams for describing an artificial neural network as an example of the plurality of machine learning models according to some example embodiments.

FIGS. 19, 20, and 21 are diagrams for describing an example of a network structure used to perform deep learning by a homomorphic operation performing device according to some example embodiments.

Referring to FIG. 19, a general neural network (e.g., an ANN) may include an input layer IL, a plurality of hidden layers HL1, HL2, . . . , HLn and an output layer OL.

The input layer IL may include i input nodes $x_1$, $x_2$, . . . , $x_i$, where i is a natural number. Input data (e.g., vector input data) IDAT whose length i may be input to the input nodes $x_1$, $x_2$, . . . , $x_i$ such that each element of the input data IDAT is input to a respective one of the input nodes $x_1$, $x_2$, . . . , $x_i$.

The plurality of hidden layers HL1, HL2, . . . , HLn may include n hidden layers, where n is a natural number, and may include a plurality of hidden nodes $h^1_1$, $h^1_2$, $h^1_3$, . . . , $h^1_m$, $h^2_1$, $h^2_2$, $h^2_3$, . . . , $h^2_m$, $h''_1$, $h''_2$, $h''_3$, . . . , $h''_m$. For example, the hidden layer HL1 may include m hidden nodes $h^1_1$, $h^1_2$, $h^1_3$, . . . , $h^1_m$, the hidden layer HL2 may include m hidden nodes $h^2_1$, $h^2_2$, $h^2_3$, . . . , $h^2_m$, and the hidden layer HLn may include m hidden nodes $h''_1$, $h''_2$, $h''_3$, . . . , $h''_m$, where m is a natural number.

The output layer OL may include j output nodes $y_1$, $y_2$, . . . , $y_j$, where j is a natural number. Each of the output nodes $y_1$, $y_2$, . . . , $y_j$ may correspond to a respective one of classes to be categorized. The output layer OL may output output values (e.g., class scores or simply scores) associated with the input data IDAT for each of the classes. The output layer OL may be referred to as a fully-connected layer and may indicate, for example, a probability that the input data IDAT corresponds to a car.

A structure of the neural network illustrated in FIG. 19 may be represented by information on branches (or connections) between nodes illustrated as lines, and a weighted value assigned to each branch, which are not illustrated. Nodes within one layer may not be connected to one another, but nodes of different layers may be fully or partially connected to one another.

Each node may receive an output of a previous node, may perform a computing operation, computation, or calculation on the received output, and may output a result of the computing operation, computation, or calculation as an output to a next node. For example, node $h^1_1$ may receive an output of a previous node $x_1$, may perform a computing operation, computation, or calculation on the received output of the previous node $x_1$, and may output a result of the computing operation, computation, or calculation as an output to a next node $h^2{}_1$. Each node may calculate a value to be output by applying the input to a specific function, e.g., a nonlinear function.

Generally, the structure of the neural network may be set in advance, and the weighted values for the connections between the nodes are set appropriately using data having an already known answer of which class the data belongs to. The data with the already known answer is referred to as "training data," and a process of determining the weighted value is referred to as "training." The neural network "learns" during the training process. A group of an independently trainable structure and the weighted value is referred to as a "model," and a process of predicting, by the model with the determined weighted value, which class the input data belongs to, and then outputting the predicted value, is referred to as a "testing" process.

The general neural network illustrated in FIG. 19 may not be suitable for handling input image data (or input sound data) because each node (e.g., the node $h^1{}_1$) is connected to all nodes of a previous layer (e.g., the nodes $x_1, x_2, \ldots, x_i$ included in the layer IL) and then the number of weighted values drastically increases as the size of the input image data increases. Thus, a convolutional neural network (CNN), which is implemented by combining the filtering technique with the general neural network, has been researched such that two-dimensional image (e.g., the input image data) is efficiently trained by the CNN.

Referring to FIG. 20, a CNN may include a plurality of layers CONV1, RELU1, CONV2, RELU2, POOL1, CONV3, RELU3, CONV4, RELU4, POOL2, CONV5, RELU5, CONV6, RELU6, POOL3 and FC. Here, CONV is a convolution layer, RELU is a Rectified Linear Unit, POOL is a pooling layer and FC is a fully connected layer.

Unlike the general neural network (e.g., that of FIG. 19), each layer of the CNN may have three dimensions of width, height and depth, and thus data that is input to each layer may be volume data having three dimensions of width, height and depth. For example, if an input image in FIG. 20 has a size of 32 widths (e.g., 32 pixels) and 32 heights and three color channels R, G and B, input data IDAT corresponding to the input image may have a size of 32*32*3. The input data IDAT in FIG. 20 may be referred to as input volume data or input activation volume.

Each of convolutional layers CONV1, CONV2, CONV3, CONV4, CONV5, and CONV6 may perform a convolutional operation on input volume data. In an image processing, the convolutional operation represents an operation in which image data is processed based on a mask with weighted values and an output value is obtained by multiplying input values by the weighted values and adding up the total multiplied values. The mask may be referred to as a filter, window, or kernel.

Particularly, parameters of each convolutional layer may include of a set of learnable filters. Every filter may be small spatially (along width and height), but may extend through the full depth of an input volume. For example, during the forward pass, each filter may be slid (more precisely, convolved) across the width and height of the input volume, and dot products may be computed between the entries of the filter and the input at any position. As the filter is slid over the width and height of the input volume, a two-dimensional activation map that gives the responses of that filter at every spatial position may be generated. As a result, an output volume may be generated by stacking these activation maps along the depth dimension. For example, if input volume data having a size of 32*32*3 passes through the convolutional layer CONV1 having four filters with zero-padding, output volume data of the convolutional layer CONV1 may have a size of 32*32*12 (e.g., a depth of volume data increases).

Each of RELU layers RELU1, RELU2, RELU3, RELU4, RELU5 and RELU6 may perform a rectified linear unit (RELU) operation that corresponds to an activation function defined by, e.g., a function $f(x)=max(0, x)$ (e.g., an output is zero for all negative input x). For example, if input volume data having a size of 32*32*12 passes through the RELU layer RELU1 to perform the rectified linear unit operation, output volume data of the RELU layer RELU1 may have a size of 32*32*12 (e.g., a size of volume data is maintained).

Each of pooling layers POOL1, POOL2 and POOL3 may perform a down-sampling operation on input volume data along spatial dimensions of width and height. For example, four input values arranged in a 2*2 matrix formation may be converted into one output value based on a 2*2 filter. For example, a maximum value of four input values arranged in a 2*2 matrix formation may be selected based on 2*2 maximum pooling, or an average value of four input values arranged in a 2*2 matrix formation may be obtained based on 2*2 average pooling. For example, if input volume data having a size of 32*32*12 passes through the pooling layer POOL1 having a 2*2 filter, output volume data of the pooling layer POOL1 may have a size of 16*16*12 (e.g., width and height of volume data decreases, and a depth of volume data is maintained).

Typically, one convolutional layer (e.g., CONV1) and one RELU layer (e.g., RELU1) may form a pair of CONV/RELU layers in the CNN, pairs of the CONV/RELU layers may be repeatedly arranged in the CNN, and the pooling layer may be periodically inserted in the CNN, thereby reducing a spatial size of image and extracting a characteristic of image.

An output layer or a fully-connected layer FC may output results (e.g., class scores) of the input volume data IDAT for each of the classes. For example, the input volume data IDAT corresponding to the two-dimensional image may be converted into a one-dimensional matrix or vector as the convolutional operation and the down-sampling operation are repeated. For example, the fully-connected layer FC may represent probabilities that the input volume data IDAT corresponds to a car, a truck, an airplane, a ship and a horse.

The types and number of layers included in the CNN may not be limited to an example described with reference to FIG. 20 and may be changed according to example embodiments. In addition, although not illustrated in FIG. 20, the CNN may further include other layers such as a softmax layer for converting score values corresponding to predicted results into probability values, a bias adding layer for adding at least one bias, or the like.

Referring to FIG. 21, a recurrent neural network (RNN) may include a repeating structure using a specific node or cell N illustrated on the left side of FIG. 21.

A structure illustrated on the right side of FIG. 21 may represent that a recurrent connection of the RNN illustrated on the left side is unfolded (or unrolled). The term "unfolded" means that the network is written out or illustrated for the complete or entire sequence including all nodes NA, NB and NC. For example, if the sequence of interest is a sentence of 3 words, the RNN may be unfolded into a 3-layer neural network, one layer for each word (e.g., without recurrent connections or without cycles).

In the RNN in FIG. 21, X represents an input of the RNN. For example, $X_t$ may be an input at time step t, and $X_{t-1}$ and $X_{t+1}$ may be inputs at time steps t−1 and t+1, respectively.

In the RNN in FIG. 21, S represents a hidden state. For example, St may be a hidden state at the time step t, and $S_{t-1}$ and $S_{t+1}$ may be hidden states at the time steps t−1 and t+1, respectively. The hidden state may be calculated based on a previous hidden state (W) and an input at a current step (U). For example, $S_t = f(UX_t + WS_{t-1})$. For example, the function f may be usually a nonlinearity function such as tan h or RELU. $S_{-1}$, which is required to calculate a first hidden state, may be typically initialized to all zeroes.

In the RNN in FIG. 21, O represents an output of the RNN. For example, $O_t$ may be an output at the time step t, and $O_{t-1}$ and $O_{t+1}$ may be outputs at the time steps t−1 and t+1, respectively. For example, if it is required to predict a next word in a sentence, it would be a vector (V) of probabilities across a vocabulary. For example, $O_t$=softmax $(VS_t)$.

In the RNN in FIG. 21, the hidden state may be a "memory" of the network. In other words, the RNN may have a "memory" which captures information about what has been calculated so far. The hidden state St may capture information about what happened in all the previous time steps. The output $O_t$ may be calculated solely based on the memory at the current time step t. In addition, unlike a traditional neural network, which uses different parameters at each layer, the RNN may share the same parameters across all time steps. This may represent the fact that the same task may be performed at each step, just with different inputs. This may greatly reduce the total number of parameters required to be trained or learned.

In some example embodiments, various services and/or applications such as a prediction of reliability information of storage device and the like may be executed and processed based on the reliability information predictor or the storage controller described above with reference to FIG. 3.

Figure 22:
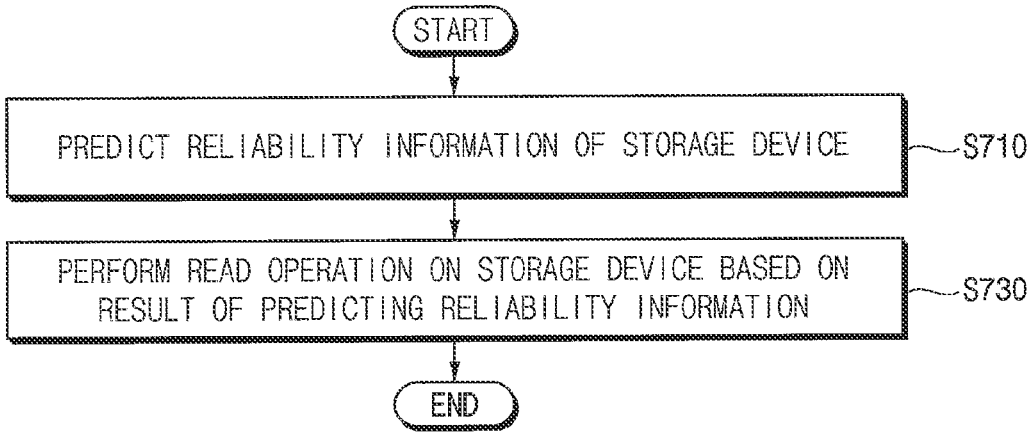
FIG. 22 is a flowchart illustrating a method of operating the storage device according to some example embodiments.

FIG. 22 is a flowchart illustrating a method of operating the storage device according to example embodiments.

Referring to FIG. 22, in a method of operating the storage device, reliability information is predicted (S710), and a read operation is performed on the storage device based on a result of the predicting the reliability information (S730).

In some embodiments, the S710 may be performed by the operations S100, S200 and S300 described above with reference to FIG. 1.

In some embodiments, the S710 may be performed whenever at least one of a read operation, a program operation, a wear leveling, a garbage collection, and/or a read reclaim operation is performed while the storage device is be driven.

Figure 23:
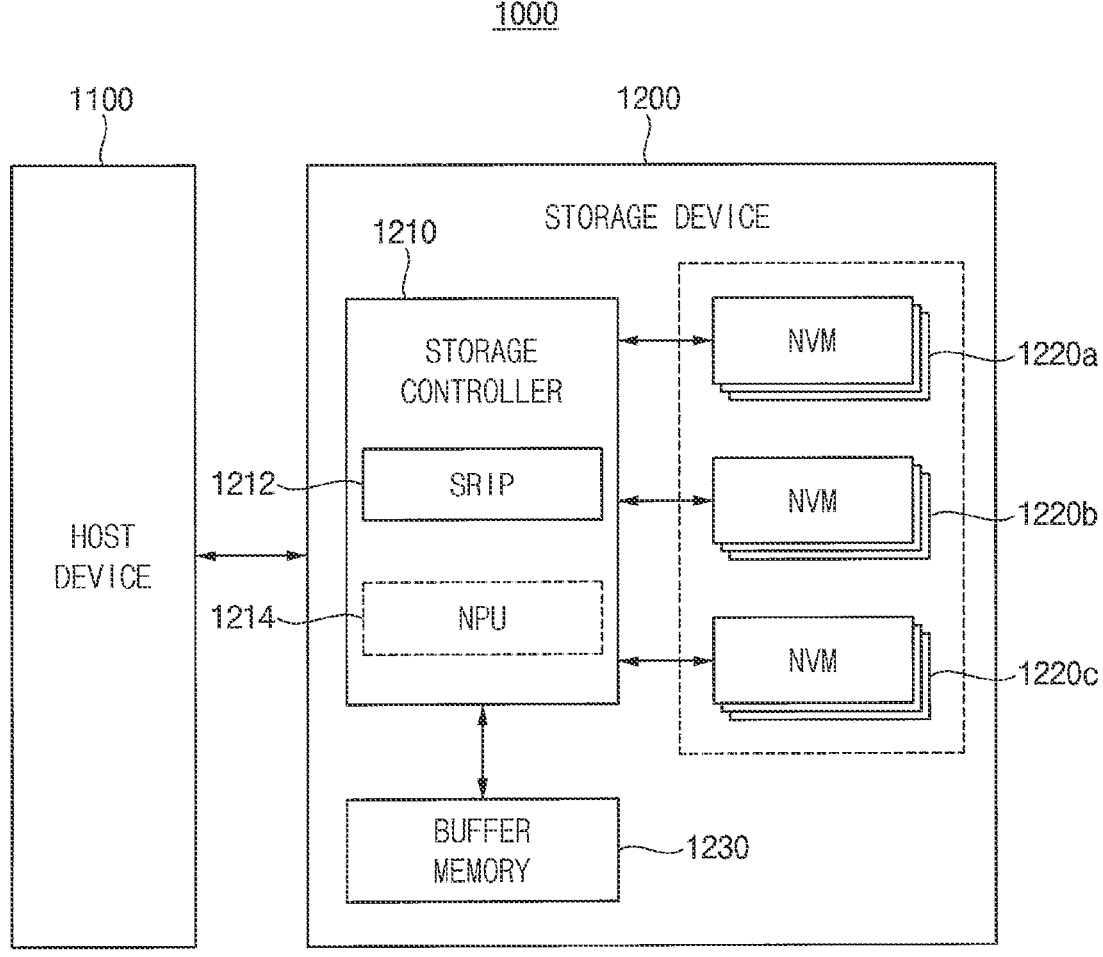
FIG. 23 is a block diagram illustrating the storage device and the storage system according to some example embodiments.

FIG. 23 is a block diagram illustrating the storage device and the storage system according to some example embodiments.

Referring to FIG. 23, a storage system 1000 may include a host device 1100 and a storage device 1200.

The storage device 1100 may control overall operations of the storage system 1000. For example, the host device 1100 may include a host processor that controls operations of the host device 1100 and executes an operating system (OS) and a host memory that stores instructions executed and processed by the host processor and data.

The storage device 1200 may be accessed by the host device 1100 and may include a storage controller 1210, a plurality of nonvolatile memories 1220a, 1220b, and 1220c, and a buffer memory 1230. The storage controller 1210 may control operations of the storage device 1200. The plurality of nonvolatile memories 1220a, 1220b, and 1220c may store a plurality of data.

The buffer memory 1230 may store commands and data executed and processed by the storage controller 1210, and temporarily store data stored in or to be stored in the plurality of nonvolatile memories 1220a, 1220b, and 1220c.

The storage system 100 of FIG. 2 may be implemented in a form of the storage device 1200, and the storage controller 1210 and the nonvolatile memories 1220a, 1220b, and 1220c may correspond to the storage controller 310 and the nonvolatile memories 320a, 320b, and 320c, respectively.

The reliability information predictor SRIP included in the storage device 1200 may correspond to the reliability information predictor 312 of FIG. 2. In some embodiments, the storage controller 1210 may further include a neural processing unit (NPU) 1214 for detecting an input/output pattern of write data.

In some embodiments, the storage device 1200 may be a solid state drive (SSD), an universal flash storage (UFS), a multi media card (MMC), an embedded MMC (eMMC), or the like. In other embodiments, the storage device 1200 may be implemented in a form of a secure digital (SD) card, a micro SD card, a memory stick, a chip card, an universal serial bus (USB) card, a smart card, a compact flash (CF) card or the like.

As described above, in the method of predicting reliability information of a storage device according to example embodiments, the operations S100, S200 and S300 of FIG. 1 may be performed to predict more efficiently reliability information of a nonvolatile memory included in the storage device. More specifically, in the method of predicting reliability information of the storage device, a model request signal may be outputted based on deterioration characteristic information and deterioration phase information. The reliability information of the nonvolatile memory may be predicted by adaptively selecting an optimal machine learning model that is one of a plurality of machine learning models based on the model request signal. That is, the method of predicting the reliability information of the storage device may efficiently predict the reliability information of the nonvolatile memory by adaptively reading parameters of the optimal machine learning model in consideration of the degree of deterioration of the nonvolatile memory.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims.

What is claimed is:

1. A method of predicting reliability information of a storage device including a plurality of nonvolatile memories, the method comprising:

outputting a model request signal corresponding to an optimal machine learning model by selecting one of a plurality of machine learning models as the optimal machine learning model, with each of the plurality of machine learning models configured to generate first reliability information related to the plurality of nonvolatile memories and the selecting of the one of the plurality of machine learning models based on deterioration characteristic information obtained by accumulating deterioration information related to the plurality of nonvolatile memories and deterioration phase information representing a degree of deterioration of the plurality of nonvolatile memories;

receiving first parameters of the optimal machine learning model based on the model request signal; and generating the first reliability information based on the deterioration characteristic information and the first parameters of the optimal machine learning model.

2. The method of claim 1, wherein:

the deterioration phase information represents the degree of the deterioration of the plurality of nonvolatile memories as a plurality of deterioration phases, and wherein selecting the one of the plurality of machine learning models comprises selecting a first machine learning model from among the plurality of machine learning models as the optimal machine learning model based on the deterioration phase information corresponding to an early deterioration phase, and selecting a second machine learning model different from the first machine learning model selected from among the plurality of machine learning models as the optimal machine learning model based on the deterioration phase information corresponding to a middle deterioration phase that is subsequent to the early deterioration phase.

3. The method of claim 2, wherein the first machine learning model has a processing speed higher than that of the second machine learning model, and the second machine learning model has an accuracy higher than that of the first machine learning model.

4. The method of claim 3, wherein:

each of the plurality of machine learning models is stored in one of a plurality of volatile memories that includes a tightly-coupled memory (TCM), a static random access memory (SRAM) and a dynamic random access memory (DRAM), and the first machine learning model is stored in the TCM, and the second machine learning model is stored in one of the SRAM and the DRAM.

5. The method of claim 1, wherein outputting the model request signal includes:

collecting the deterioration characteristic information; and generating the deterioration phase information based on the deterioration characteristic information, the deterioration phase information representing the degree of the deterioration of the plurality of nonvolatile memories as a plurality of deterioration phases.

6. The method of claim 5, wherein collecting the deterioration characteristic information includes:

generating the deterioration characteristic information based on at least one of commands issued by a storage controller included in the storage device; and updating the deterioration characteristic information based on at least one of the commands.

7. The method of claim 6, wherein the deterioration characteristic information includes at least one of program/erase (P/E) cycles, read counts, a retention time, a number of on-cells, and a number of error bits for the plurality of nonvolatile memories.

8. The method of claim 7, wherein the commands include a program command, a read command, an erase command, a retention time generating command, and an on-cell count generating command.

9. The method of claim 8, wherein updating the deterioration characteristic information includes:

updating the P/E cycles based on the program command and the erase command; and updating the read counts based on the read command.

10. The method of claim 8, wherein updating the deterioration characteristic information includes:

updating the retention time based on the program command and the retention time generating command;

updating the number of on-cells based on the on-cell count generating command; and updating the number of error bits based on one of the read command and the program command.

11. The method of claim 5, wherein generating the deterioration phase information includes:

retrieving the deterioration characteristic information;

retrieving a lookup table representing a relationship between the deterioration characteristic information and the plurality of deterioration phases; and generating the deterioration phase information based on the deterioration characteristic information and the lookup table.

12. The method of claim 1, wherein outputting the model request signal includes:

evaluating the plurality of machine learning models according to a plurality of model evaluation criteria;

storing a plurality of parameters associated with each of the plurality of machine learning models in different areas of a plurality of volatile memories included in the storage device based on an evaluation result according to the plurality of model evaluation criteria; and selecting one of the plurality of machine learning models based on the deterioration phase information.

13. The method of claim 12, wherein the plurality of machine learning models are based on at least one of a convolution neural network (CNN), a recurrent neural network (RNN), a support vector machine (SVM), a linear regression, a logistic regression, a naive bayes classification, a random forest, a decision tree, and/or k-nearest neighbor (KNN) algorithms.

14. The method of claim 12, wherein the plurality of model evaluation criteria include first to X-th model evaluation criteria, where X is an integer greater than or equal to two, and each of the first to X-th model evaluation criteria is a criterion for sorting the plurality of machine learning models based on at least one of a processing speed and an accuracy of the plurality of machine learning models.

15. The method of claim 14, wherein:

the plurality of volatile memories include a tightly-coupled memory (TCM), a static random access memory (SRAM) and a dynamic random access memory (DRAM), numbers of the plurality of parameters included in the plurality of machine learning models are different from each other, the plurality of machine learning models are classified into first machine learning models, second machine learning models and third machine learning models based on the numbers of the plurality of parameters, the first machine learning models are stored in the TCM, the second machine learning models are stored in the SRAM, and the third machine learning models are stored in the DRAM.

16. The method of claim 15, wherein:

a number of parameters included in the first machine learning models is smaller than a number of the parameters included in the second machine learning models, and the number of parameters included in the second machine learning models is smaller than a number of the parameters included in the third machine learning models.

17. The method of claim 15, wherein receiving the first parameters of the optimal machine learning model includes:

when one of the first machine learning models is selected as the optimal machine learning model, receiving the first parameters via a TCM interface; and when one of the second machine learning models and the third machine learning models is selected as the optimal machine learning model, receiving the first parameters via a buffer memory interface.

18. A method of operating a storage device including a plurality of nonvolatile memories, the method comprising:

predicting reliability information of the storage device; and performing a read operation on the storage device based on a result of predicting the reliability information, wherein the predicting the reliability information of the storage device comprises:

outputting a model request signal corresponding to an optimal machine learning model by selecting one of a plurality of machine learning models as the optimal machine learning model, with each of the plurality of machine learning models configured to generate first reliability information related to the plurality of nonvolatile memories and the selecting of the one of the plurality of machine learning models based on deterioration characteristic information obtained by accumulating deterioration information related to the plurality of nonvolatile memories and deterioration phase information representing a degree of deterioration of the plurality of nonvolatile memories;

receiving first parameters of the optimal machine learning model based on the model request signal; and generating the first reliability information based on the deterioration characteristic information and the first parameters.

19. The method of claim 18, wherein the deterioration phase information represents the degree of the deterioration of the plurality of nonvolatile memories as a plurality of deterioration phases, and wherein selecting the one of the plurality of machine learning models comprises selecting a first machine learning model from among the plurality of machine learning models as the optimal machine learning model when the deterioration phase information corresponds to an early deterioration phase, and selecting a second machine learning model different from the first machine learning model from among the plurality of machine learning models as the optimal machine learning model when the deterioration phase information corresponds to a middle deterioration phase that is subsequent to the early deterioration phase.

20. A method of predicting reliability information of a storage device including a plurality of nonvolatile memories, the method comprising:

collecting deterioration characteristic information by accumulating deterioration information of the plurality of nonvolatile memories;

generating deterioration phase information based on the deterioration characteristic information, wherein the deterioration phase information represents a degree of the deterioration of the plurality of nonvolatile memories as one of a plurality of deterioration phases;

selecting one of a plurality of machine learning models as an optimal machine learning model based on the deterioration phase information and the deterioration phase information;

outputting a model request signal corresponding to the optimal machine learning model;

receiving first parameters of the optimal machine learning model based on the model request signal; and generating first reliability information based on the deterioration characteristic information and the first parameters;

wherein:

selecting the one of the plurality of machine learning models comprises selecting a first machine learning model from among the plurality of machine learning models as the optimal machine learning model when the deterioration phase information corresponds to an early deterioration phase, and selecting a second machine learning model different from the first machine learning model from among the plurality of machine learning models as the optimal machine learning model when the deterioration phase information corresponds to a middle deterioration phase that is subsequent to the early deterioration phase.

* * * * *